US012763132B2

(12) United States Patent
Kim et al.

(10) Patent No.: US 12,763,132 B2
(45) Date of Patent: Oct. 13, 2026

(54) VOLATILE MEMORY DEVICE

(71) Applicant: SAMSUNG ELECTRONICS CO., LTD., Suwon-si (KR)

(72) Inventors: Ki-Heung Kim, Suwon-si (KR); Taeyoung Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 18/657,523

(22) Filed: May 7, 2024

(65) Prior Publication Data

US 2024/0395313 A1 Nov. 28, 2024

(30) Foreign Application Priority Data

May 23, 2023 (KR) ........................ 10-2023-0066576
Sep. 14, 2023 (KR) ........................ 10-2023-0122763

(51) Int. Cl.
*G11C 11/408* (2006.01)

(52) U.S. Cl.
CPC ...... *G11C 11/4087* (2013.01); *G11C 11/4085* (2013.01)

(58) Field of Classification Search
CPC .................................................. G11C 11/4087
See application file for complete search history.

(56) References Cited

U.S. PATENT DOCUMENTS

| | | | | |
|---|---|---|---|---|
| 8,631,220 | B2 | 1/2014 | Smith et al. | |
| 10,853,168 | B2 | 12/2020 | Marietta | |
| 11,200,118 | B2 | 12/2021 | Buerkle et al. | |
| 11,288,188 | B1 | 3/2022 | Tummala et al. | |
| 2012/0297256 | A1 | 11/2012 | Plondke et al. | |
| 2014/0075259 | A1 | 3/2014 | Tam | |
| 2017/0194045 | A1 | 7/2017 | Kang | |
| 2019/0214065 | A1 | 7/2019 | Kim et al. | |
| 2021/0141692 | A1 | 5/2021 | Agarwal et al. | |
| 2021/0286727 | A1 | 9/2021 | Bains | |
| 2022/0238174 | A1 | 7/2022 | Schaefer et al. | |
| 2023/0205428 | A1* | 6/2023 | Kim | G11C 11/4078 711/105 |
| 2023/0205440 | A1* | 6/2023 | Jo | G06F 3/064 711/154 |
| 2024/0296115 | A1* | 9/2024 | Givant | G06F 11/0769 |

OTHER PUBLICATIONS

Extended European Search Report in European Appln. No. 24174058.8, mailed on Jul. 16, 2024, 7 pages.

* cited by examiner

*Primary Examiner* — Hoai V Ho
(74) *Attorney, Agent, or Firm* — Fish & Richardson P.C.

(57) ABSTRACT

A memory device includes a bank connected to a plurality of wordlines and a plurality of column select lines (CSLs). Among the plurality of wordlines, every r-th wordline in a column direction may be allocated for metadata where r is a positive integer.

20 Claims, 34 Drawing Sheets

NSB — Normal 8(7); MSB — Meta 1

| Normal 8(7) | | | Meta 1 | | | |
|---|---|---|---|---|---|---|
| WL | CSLx[0:15] | | WL | CSLx[m:n] | | |
| 0 | 0 | 63 | 7 | CSLx[0:1] | 0 | 63 |
| 1 | 0 | 63 | 7 | CSLx[2:3] | 0 | 63 |
| 2 | 0 | 63 | 7 | CSLx[4:5] | 0 | 63 |
| 3 | 0 | 63 | 7 | CSLx[6:7] | 0 | 63 |
| ⋮ | | | ⋮ | | | |
| 6 | 0 | 63 | 7 | CSLx[12:13] | 0 | 63 |
| 7 | 0 | 63 | 7 | CSLx[14:15] | 0 | 63 |

Unassigned

FIG. 10

NSB MSB

| Normal 16(15) | | | Meta 1 | | | |
|---|---|---|---|---|---|---|
| WL | CSLx[0:15] | | WL | CSLx[m] | | |
| 0 | 0 | 63 | 15 | CSLx[0] | 0 | 63 |
| 1 | 0 | 63 | 15 | CSLx[1] | 0 | 63 |
| 2 | 0 | 63 | 15 | CSLx[2] | 0 | 63 |
| 3 | 0 | 63 | 15 | CSLx[3] | 0 | 63 |
| ⋮ | | | ⋮ | | | |
| 14 | 0 | 63 | 15 | CSLx[14] | 0 | 63 |
| 15 | 0 | 63 | 15 | CSLx[15] | 0 | 63 |

Unassigned

VOLATILE MEMORY DEVICE

CROSS-REFERENCE TO RELATED APPLICATION(S)

This U.S. non-provisional application claims priority under 35 USC § 119 to Korean Patent Application No. 10-2023-0066576, filed on May 23, 2023, and Korean Patent Application No. 10-2023-0122763, filed on Sep. 14, 2023, in the Korean Intellectual Property Office, the disclosures of which are herein incorporated by reference in their entireties.

BACKGROUND

Semiconductor memory devices may be classified into volatile memory devices and nonvolatile memory devices. Volatile memory devices lose their stored data when their power supplies are interrupted. A dynamic random access memory (DRAM) is a type of nonvolatile memory device and is used in various fields such as mobile systems, servers, and graphics devices.

SUMMARY

A volatile memory device is described for allocating specific data.

An example memory device includes a bank connected to a plurality of wordlines and a plurality of column select lines (CSLs). Among the plurality of wordlines, every r-th wordline (where r is a positive integer) may be allocated for metadata in a column direction.

An example memory device includes a bank connected to a plurality of wordlines and a plurality of column select lines (CSLs), a row decoder connected to the plurality of wordlines and extending in a column direction, and a column decoder connected to the plurality of CSLs and extending in a row direction. Among the plurality of wordlines, every r-th wordline (where r is a positive integer) may be allocated for metadata in the column direction.

An example memory device includes a subbank divided in a row direction and comprising a plurality of subsets each divided in the row direction, a plurality of wordlines extending in the row direction and connected to the subbank, wherein among the plurality of wordlines, every r-th wordline (where r is a positive integer) is allocated for metadata in a column direction, and a plurality of column select line (CSL) subsets extending in the column direction and connected to the subbank.

BRIEF DESCRIPTION OF THE DRAWINGS

The above and other aspects, features, and advantages of the present disclosure will be more clearly understood from the following detailed description, taken in conjunction with the accompanying drawings.

FIG. 8 is a diagram illustrating an example of region "A" of FIG. 7.

FIGS. 9 and 10 are diagrams illustrating column select signals of normal data and metadata.

DETAILED DESCRIPTION

Hereinafter, example embodiments will be described with reference to the accompanying drawings.

Figure 1:
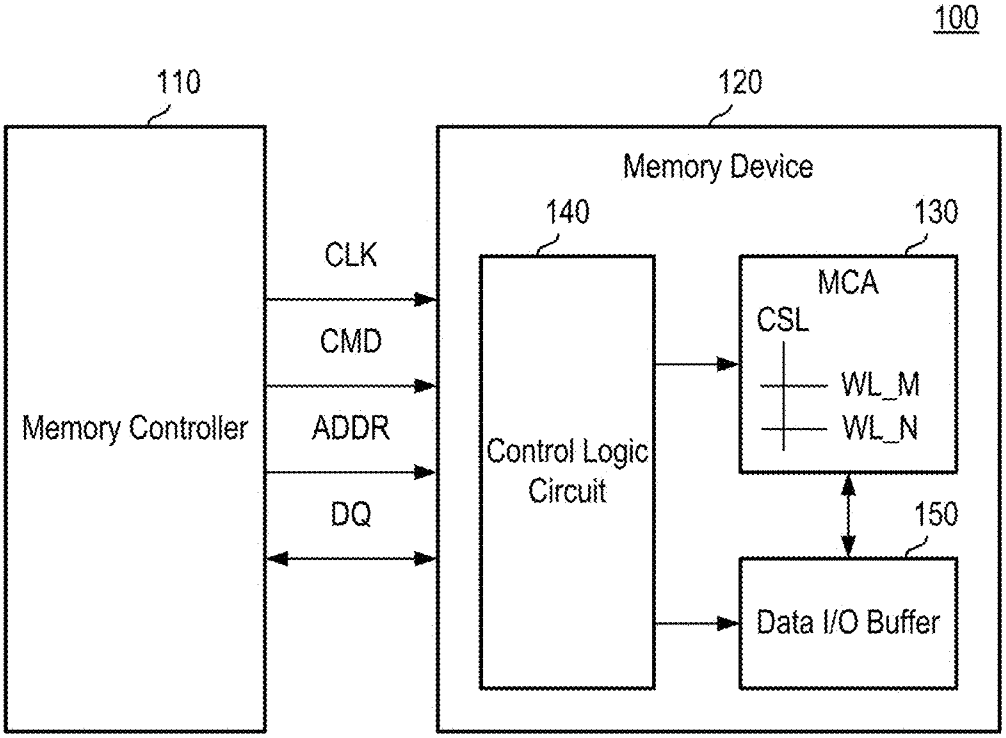
FIG. 1 is a diagram illustrating an example memory system.

FIG. 1 is a diagram illustrating an example memory system.

Referring to FIG. 1, a memory system 100 according to an example implementation may include a memory controller 110 and a memory device 120.

The memory controller 110 may control the overall operation of the memory system 100, and may control data exchange between the memory device 120 and a host device connected to the memory system 100. For example, the memory controller 110 may control the memory device 120 to write or read data based on a request from the host device.

The memory controller 110 may communicate with the memory device 120 through a memory interface or communicate with a host device through a host interface. Accordingly, the memory controller 110 may mediate a signal between the host device and the memory device 120. The memory controller 110 may control the memory device 120 based on a command CMD for controlling the memory device 120. For example, the memory device 120 may include a dynamic random access memory (DRAM), a double data rate 4 (DDR4) synchronous DRAM (SDRAM), a DDR5 SDRAM, a DDR6 SDRAM, a low-power DDR4 (LPDDR4) SDRAM, an LPDDR5 SDRAM, an LPDDR6 SDRAM, or the like. However, example implementations are not limited thereto, and the memory device 120 may include a nonvolatile memory device. However, in an example the memory device 120 is a volatile memory.

The memory controller 110 may transmit the above-described command CMD, a clock signal CLK, and an address ADDR to the memory device 120. The memory controller 110 may provide data DQ to the memory device 120, and may rec receive data DQ from the memory device 120. The memory device 120 may include a memory cell array 130 in which data DQ is stored, a control logic circuit 140, and a data input/output buffer 150, or the like.

The memory cell array 130 may include a plurality of memory cells. Each of the memory cells may store data (for example, 1 bit). The memory cell array 130 may include a plurality of wordlines and a plurality of column select lines (CSLs), and the plurality of memory cells may be connected to each wordline and each CSL. In this case, memory cells connected to a wordline may be referred to as rows, and memory cells selected by a CSL may be referred to as columns.

A portion of the wordlines may be allocated for metadata. The metadata may be defined as data used to improve performance of the memory device 120 and to enhance security of the memory device 120. Except for a wordline WL_M allocated for the metadata, the remaining wordlines WL_N may be allocated for normal data. The normal data may be defined as data other than the metadata.

According to various embodiments, a ratio of normal data to metadata accessed by the memory device 120 may be required. For example, the required ratio of normal data and metadata accessed by the memory device 120 (hereinafter, a required normal/meta ratio) may be set to n:1 (where n is a positive integer). For example, n may be 8 or 16, but example implementations are not limited thereto. For example, in the case in which n=8, 8 bytes of metadata may be required to be accessed when 64 bytes of normal data are accessed.

One or more bitlines may be connected to a CSL. Therefore, when a single CSL is selected, for example, when a single column is selected, all of the one or more bitlines connected to the selected CSL may be selected, and data in units of burst length may be simultaneously input and output from the one or more selected bitlines. For example, eight bitlines may be connected to a single CSL, but example implementations are not limited thereto.

The control logic circuit 140 may receive a command CMD and an address ADDR from the memory controller 110. The control logic circuit 140 may control the memory cell array 130 based on the command CMD and the address ADDR. For example, the control logic circuit 140 may decode the command CMD and generate control signals corresponding to the decoded command CMD. In addition, the control logic circuit 140 may generate internal command (CMD) signals such as a refresh signal, an active signal, a precharge signal, a read signal, or a write signal. In addition, the control logic circuit 140 may decode the address ADDR and select or activate a wordline and a CSL corresponding to the decoded address ADDR.

The data input/output buffer 150 may provide normal data and/or metadata to memory cell array 130 based on a clock signal CLK when a write operation is performed, or may provide normal data and/or metadata provided from memory cell array 130 to the memory controller 110 based on a clock signal CLK when a read operation is performed.

According to various implementations, the memory system 100, the memory controller 110, and the memory device 120 included in the memory system 100 may operate in a metadata mode. The metadata mode may be an operation mode in which metadata is input or output. When operating in the metadata mode, the memory system 100 may perform a write or read operation based on the wordline WL_M allocated for metadata, according to various implementations (FIGS. 2 to 36) to be described below.

For example, the memory controller 110 and the control logic circuit 140 may control the memory device 120 to simultaneously write or read normal data and metadata through a wordline WL_N allocated to the normal data and a wordline WL_M allocated to the metadata.

In an example implementation, the memory system 100 may turn off the metadata mode and operate in a normal mode. In the normal mode, the wordline WL_M that has been allocated for the metadata in the metadata mode may also be allocated for the normal data. Accordingly, in the normal mode, the memory system 100 may activate at least a portion of the plurality of wordlines included in the memory device 120 to write or read the normal data from the memory device 120. In addition, the operation of the memory system 100 in the normal mode may conform to an operation of DRAM, DDR4, SDRAM, DDR5 SDRAM, DDR6 SDRAM, LPDDR4 SDRAM, LPDDR5 SDRAM, or LPDDR6 SDRAM.

According to the above-described implementations, a portion of the wordlines connected to the memory cell array 130 included in the memory device 120 may be allocated for, for example, the metadata. For example, a portion of carved rows may be used for metadata in terms of rows. When additional registers or lines (for example, global input/output (GIO) lines, or the like) are allocated for metadata, overhead may occur due to a chip size. However, according to example implementations, a portion of existing wordlines may be allocated for metadata to reduce overhead occurring due to a chip size.

Figure 2:
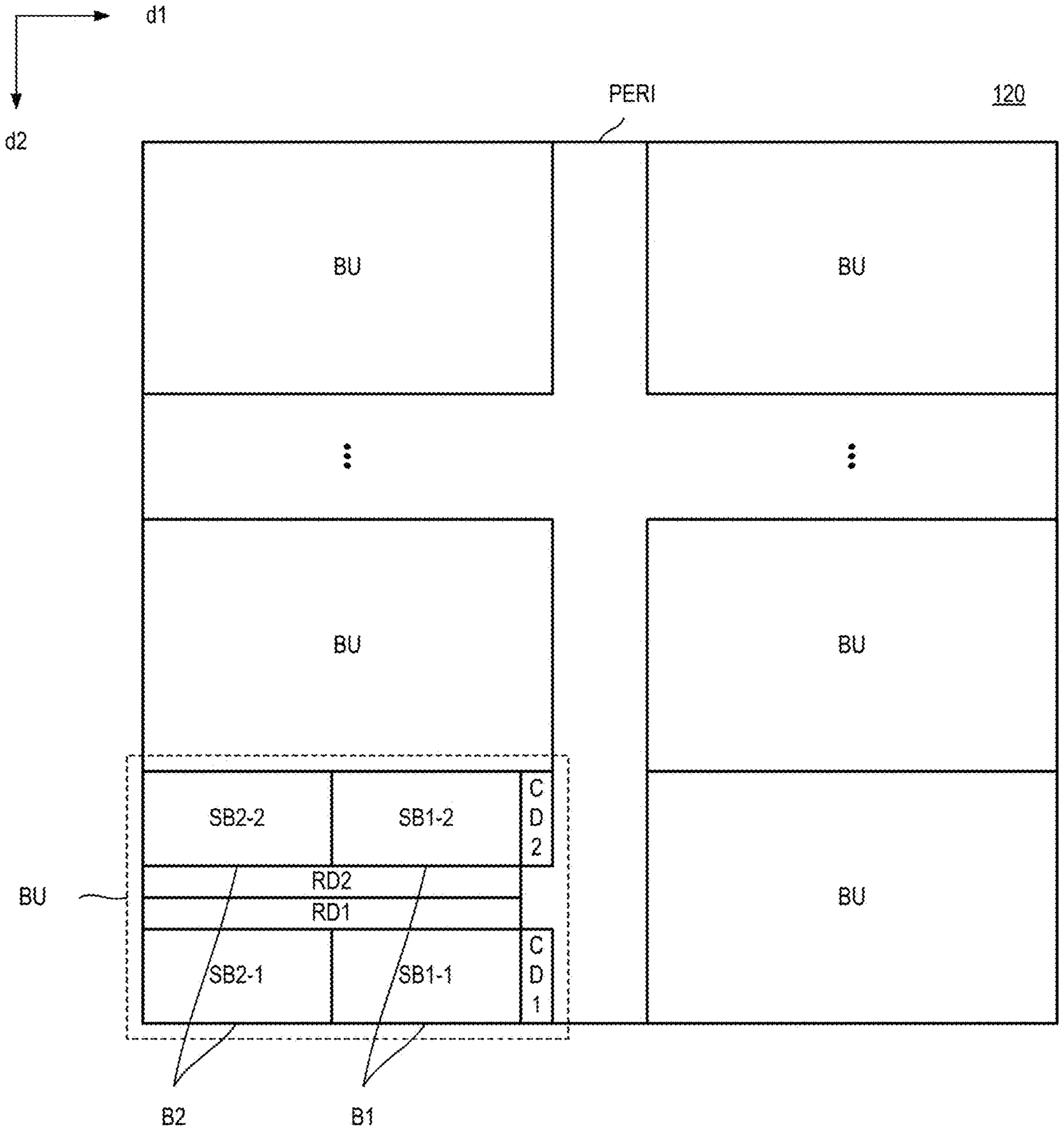
FIG. 2 is a plan view of an example memory device.

FIG. 2 is a plan view of a memory device according to an example implementation.

Referring to FIG. 2, the memory device 120 may include a bank unit BU and a peripheral circuit region PERI.

The bank unit BU, also known as a "bank group," may be provided in plural depending on the capacity of the memory device 120. A portion of the plurality of bank units BU and the remaining portion may be arranged in a row direction d2 with a peripheral circuit region PERI interposed therebetween. Each of the bank units BU may include a plurality of banks. Each of the plurality of banks may include a plurality of mats including a plurality of memory cells.

According to an example implementation, each of the plurality of banks may include a plurality of subbanks. The plurality of subbanks included in each of the banks may correspond to the same bank address. In the following implementations including FIG. 2, an example will be described in which two subbanks are included in a single bank, but example embodiments are not limited thereto. A plurality of subbanks may be arranged in a row direction d2 within a single bank with row decoders RD1 and RD2 interposed therebetween. For example, the first bank B1 may include a 1-1-th subbank SB1-1 and a 1-2-th subbank SB1-2. The 1-1-th subbank SB1-1 and the 1-2-th subbank SB1-2 may be arranged in the row direction d2 with the row decoders RD1 and RD2 interposed therebetween. In addition, the second bank B2 arranged in a column direction d1 from the first bank B1 may include a 2-1-th subbank SB2-1 and a 2-2-th subbank SB2-2. The 2-1-th subbank SB2-1 and the 2-2-th subbank SB2-2 may be arranged in the row direction d2 with the row decoders RD1 and RD2 interposed therebetween.

The row decoders RD1 and RD2 may extend in the column direction d1 and may be provided in a number corresponding to the number of banks included in a single bank unit BU. According to an example implementation, the row decoders RD1 and RD2 may select wordlines connected to subbanks included in different banks based on decoding a row address. For example, the first row decoder RD1 may select a wordline connected to the 1-1-th subbank SB1-1 and the 2-1-th subbank SB2-1, and the second row decoder RD2 may select a wordline connected to the 1-2-th subbank SB1-2 and the 2-2-th subbank SB2-2.

The column decoders CD1 and CD2 may extend in the row direction d2 and may be provided in a number corresponding to the number of banks included in a single bank unit BU. According to an example implementation, the column decoders CD1 and CD2 may select a CSL connected to a subbank included in the same bank based on decoding a column address. For example, the first column decoder CD1 may select a CSL connected to the 1-1-th subbank SB1-1 and the 2-1-th subbank SB2-1, and the second column decoder CD2 may select a CSL connected to the 1-2-th subbank SB1-2 and the 2-2-th subbank SB2-2.

Figure 3:
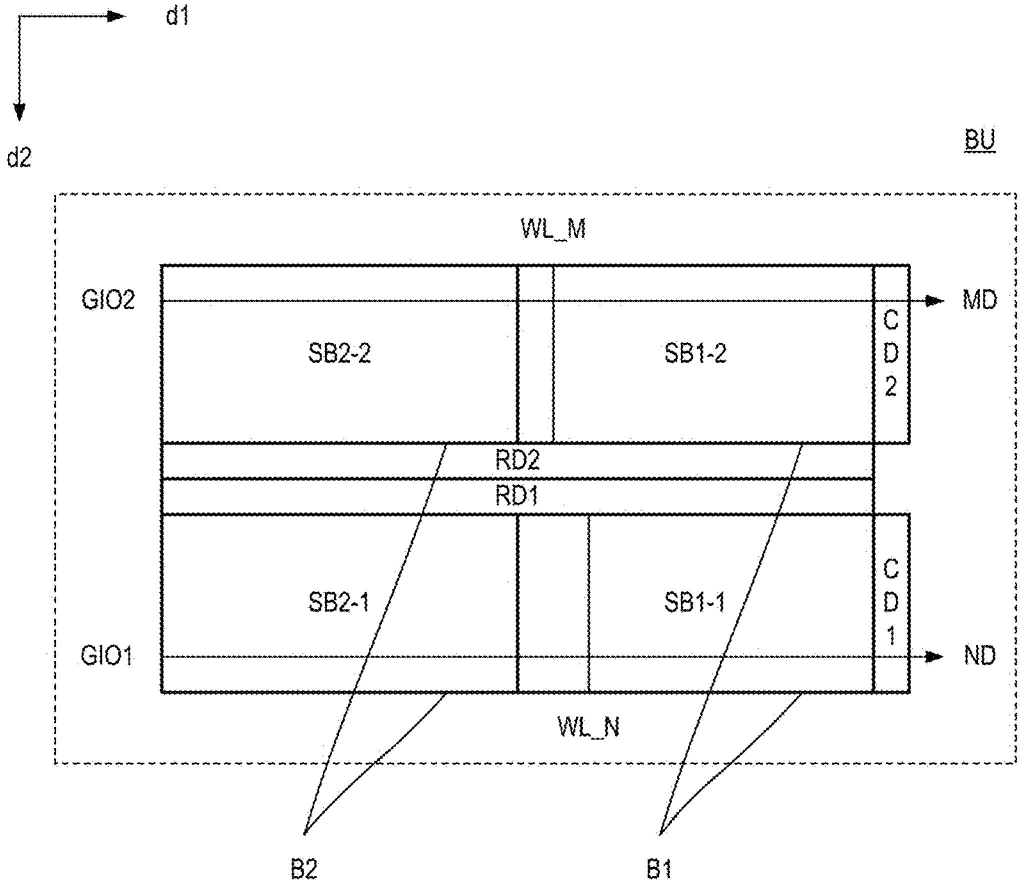
FIGS. 3 and 4 are diagrams illustrating a read operation of a bank unit.
Figure 4:
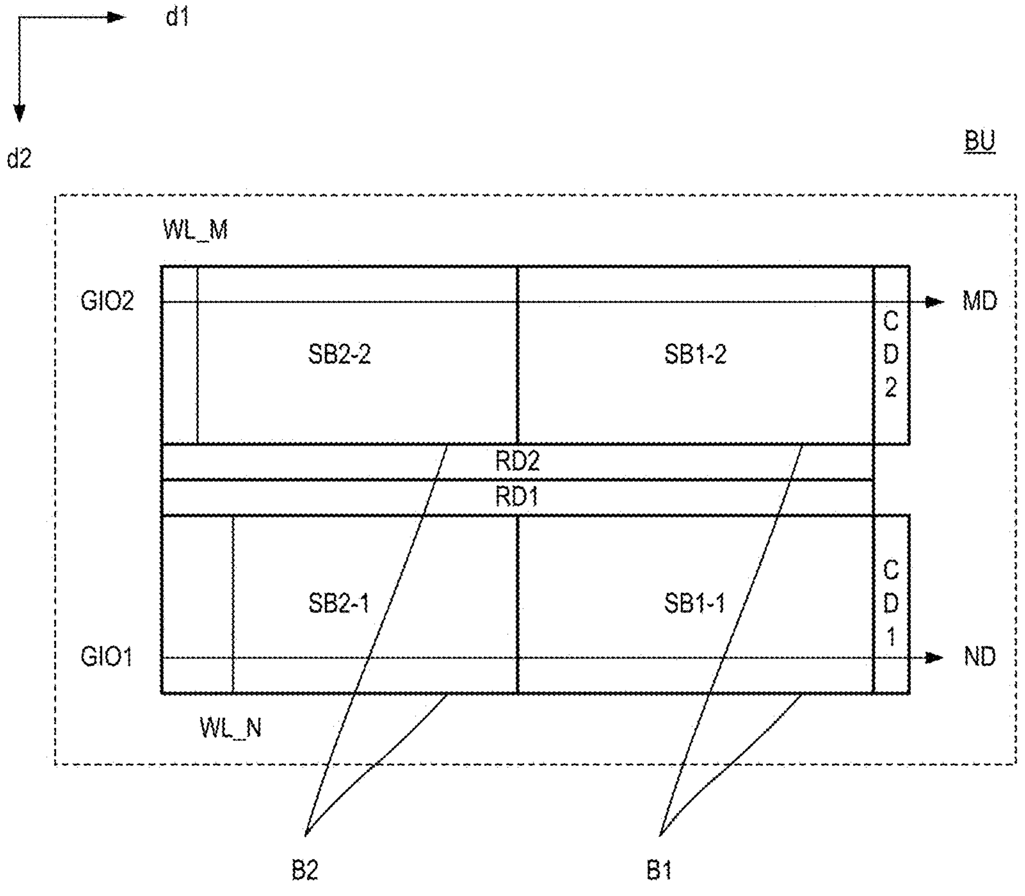

FIGS. 3 and 4 are diagrams illustrating an example read operation of a bank unit according to various implementations.

Referring to FIG. 3, a portion of the wordlines connected to the 1-1-th subbank SB1-1 may be used as normal data wordlines WL_N, and a portion of the wordlines connected to the 1-2-th subbank SB1-1 may be used as metadata wordlines WL_M. In this case, a metadata wordline WL_M of the 1-2-th subbank SB1-2 may be a metadata wordline WL_M corresponding to a normal data wordline WL_N of the 1-1-th subbank SB1-1, and a portion of the memory cells connected to the metadata wordline WL_M of the 1-2-th subbank SB1-2 may be used to store metadata corresponding to normal data stored in a memory cell connected to the normal data wordline WL_N of the 1-1-th subbank SB1-1. At the same time, a portion of the wordlines connected to the 1-2-th subbank SB1-2 may be used as normal data wordlines, and a portion of the wordlines connected to the 1-1-th subbank SB1-1 may be used as metadata wordlines. In this case, a metadata wordline of the 1-1-th subbank SB1-1 is a metadata wordline corresponding to the normal data wordline of the 1-2-th subbank SB1-2, and a portion of the memory cells connected to the metadata wordline WL_M of the 1-1-th subbank SB1-1 may be used to store metadata corresponding to normal data stored in a memory cell connected to the normal data wordline WL_N of the 1-2-th subbank SB1-2.

According to the example implementation of FIG. 3, a first bank B1 may include a plurality of subbanks, a 1-1-th subbank SB1-1 and a 1-2th subbank SB1-2, which do not share GIO. Accordingly, the metadata wordline WL_M corresponding to the normal data wordline WL_N of the 1-1-th subbank SB1-1 may be allocated to the 1-2-th subbank SB1-2 that does not share GIO with the 1-1-th subbank SB1-1. In addition, the metadata wordline corresponding to the normal data wordline of the 1-1th subbank BS1-1 may be allocated to the 1-2-th subbank SB2-1 that does not share GIO with the 1-2-th subbank SB1-2. Accordingly, when normal data is written or read in the 1-1-th subbank SB1-1, metadata corresponding to normal data may be simultaneously written in or read from the metadata wordline WL_M of the 1-2-th subbank SB1-2 corresponding to the normal data wordline WL_N of the 1-1-th subbank SB1-1. In contrast, when normal data is written or read in the 1-2-th subbank SB1-2, normal data of the 1-2-th subbank SB1-2 may be simultaneously written in or read from a metadata wordline corresponding to the normal data wordline of the 1-2-th subbank SB1-2 in the 1-1-th subbank SB1-1.

According to an example implementation, normal data and metadata corresponding to the normal data may be simultaneously written in the first bank B1. When a read operation is performed on normal data ND and metadata MD written in the first bank B1, the normal data ND and the metadata MD may be simultaneously read through the two wordlines WL_M and WL_N by simultaneously activating two wordlines WL_M and WL_N for each subbank (each of the 1-1-th subbank SB1-1 and 1-2-th subbank SB1-2). For example, a first row decoder RD1 and a second row decoder RD2 may simultaneously select the normal data wordline WL_N and the metadata wordline WL_M, respectively. In addition, a specific CSL may be selected through a first column decoder CD1 and a second column decoder CD2.

According to an example implementation, write operations of normal data and metadata corresponding to the normal data may be simultaneously performed. When write operations of the normal data ND and the metadata MD are performed in the first bank B1, each subbank (each of the 1-1-th subbank SB1-1 and the 1-2-th subbank SB1-2), the normal data ND and the metadata MD may be simultaneously written through the two wordlines WL_M and WL_N by activating both of the wordlines WL_M and WL_N. For example, the first row decoder RD1 and the second row decoder RD2 may simultaneously select the normal data wordline WL_N and the metadata wordline WL_M, respectively. In addition, a specific CSL may be selected through the first column decoder CD1 and the second column decoder CD2.

Then, data on a selected wordline and a CSL may be read or written through a GIO line connected to each subbank. GIO may extend in a column direction d1 and be spaced apart in a row direction d2 According to an example implementation, first GIO GIO1 may be configured to be shared with the 1-1-th subbank SB1-1 of the first bank B1 and the 2-1-th subbank SB2-1 of the second bank B2, and second GIO GIO2 may be configured to be shared with the 1-2-th subbank SB1-2 of the first bank B1 and the 2-2-th subbank SB2-2 of the second bank B2. For example, subbanks belonging to different banks may be configured to share the same GIO. Subbanks belonging to different banks may share the same GIO, so that a single GIO may be used in both read and write operations of different subbanks.

Referring to FIG. 4, a portion of the wordlines connected to the 2-1-th subbank SB2-1 may be used as normal data wordlines WL_N, and a portion of the wordlines connected to the 2-2-th subbank SB2-2 may be used as metadata wordlines WL_M. In this case, the metadata wordline WL_M of the 2-2-th subbank SB2-2 may be a metadata wordline corresponding to the normal data wordline WL_N of the 2-1-th subbank SB2-1, and a portion of the memory cells connected to the metadata wordline WL_M of the 2-2-th subbank SB2-2 may be used to store metadata corresponding to normal data stored in the memory cell connected to the normal data wordlines WL_N of the 2-1-th subbank SB2-1. At the same time, a portion of the wordlines connected to the 2-2-th subbank SB2-2 may be used as normal data wordlines, and a portion of the wordlines connected to the 2-1-th subbank SB2-1 may be used as metadata wordlines. In this case, the metadata wordline of the 2-1-th subbank SB2-1 may be a metadata wordline corresponding to a normal data wordline of the 2-2-th subbank SB2-2, and a portion of the memory cells connected to the metadata wordline WL_M of the 2-1-th subbank SB2-1 may be used to store metadata corresponding to normal data stored in a memory cell connected to the normal data wordline WL_N of the 2-2-th subbank SB2-2.

According to the example implementation of FIG. 4, the second bank B2 may include a plurality of subbanks, a 2-1-th subbank SB2-1, and a 2-2-th subbank SB2-2, which do not share GIO. Accordingly, the metadata wordline WL_M corresponding to the normal data wordline WL_N of the 2-1-th subbank SB2-1 may be allocated to the 2-2-th subbank SB2-2 that does not share GIO with the 2-1-th subbank SB2-1. In addition, a metadata wordline corresponding to the normal data wordline of the 2-2-th subbank SB2-2 may be allocated to the 2-1-th subbank SB2-1 that does not share GIO with the 2-2-th subbank SB2-2. Accordingly, when normal data is written read in the 2-1-th subbank SB2-1, metadata corresponding to normal data may be simultaneously written in or read from the metadata wordline WL_M of the 2-2 subbank SB2-2 corresponding to the normal data wordline WL_N of the 2-1-th subbank SB2-1. In contrast, when normal data is written or read in the 2-2-th subbank SB2-2, metadata of the normal data may be simultaneously written in or read from the metadata wordline in the 2-1-th subbank SB2-1 corresponding to the normal data wordline of the 2-2-th subbank SB2-2.

According to an example implementation, normal data and metadata corresponding to the normal data may be simultaneously written in the second bank B2. When a read operation is performed on the normal data ND and metadata MD written in the second bank B2, the normal data ND and the metadata MD may be simultaneously read through the two wordlines WL_M and WL_N by simultaneously activating the two wordlines WL_M and WL_N for each subbank (each of the 2-1-th subbank SB2-1 and 2-2 subbank SB2-2).

According to an example implementation, write operations may be simultaneously performed on normal data and simultaneously on metadata corresponding to the normal data. When write operations on normal data ND and on metadata MD are performed in the second bank B2, the normal data ND and the metadata MD may be simultaneously written through the two wordlines WL_M and WL_N by simultaneously activating the two wordlines WL_M and WL_N for each subbank (each of the 2-1-th subbank SB2-1 and the 2-2-th subbank SB2-2). For example, the first row decoder RD1 and the second row decoder RD2 may simultaneously select the normal data wordline WL_N and the metadata wordline WL_M, respectively. Additionally, a specific CSL may be selected through the first column decoder CD1 and the second column decoder CD2.

Then, a wordline and a CSL may be selected through row decoders RD1 and RD2 and the column decoders CD1 and CD2, and data on the selected wordline and the selected CSL, not shown, may be read or written through a GIO line connected to each subbank. For example, the same GIO may be used to read data from the subbank included in the first bank B1 as illustrated in FIG. 3 and to read data from the subbank included in the second bank B2 as illustrated in FIG. 4.

According to the above-described implementation, a single bank may include subbanks divided with a row decoder interposed therebetween, and thus different banks may share the same GIO. Therefore, when the normal data wordline and the metadata wordline are simultaneously activated, normal data and metadata may be simultaneously output without a timing loss. In addition, subbanks of different banks may share the same GIO to simultaneously output normal data and metadata without additional GIO.

Figure 5:
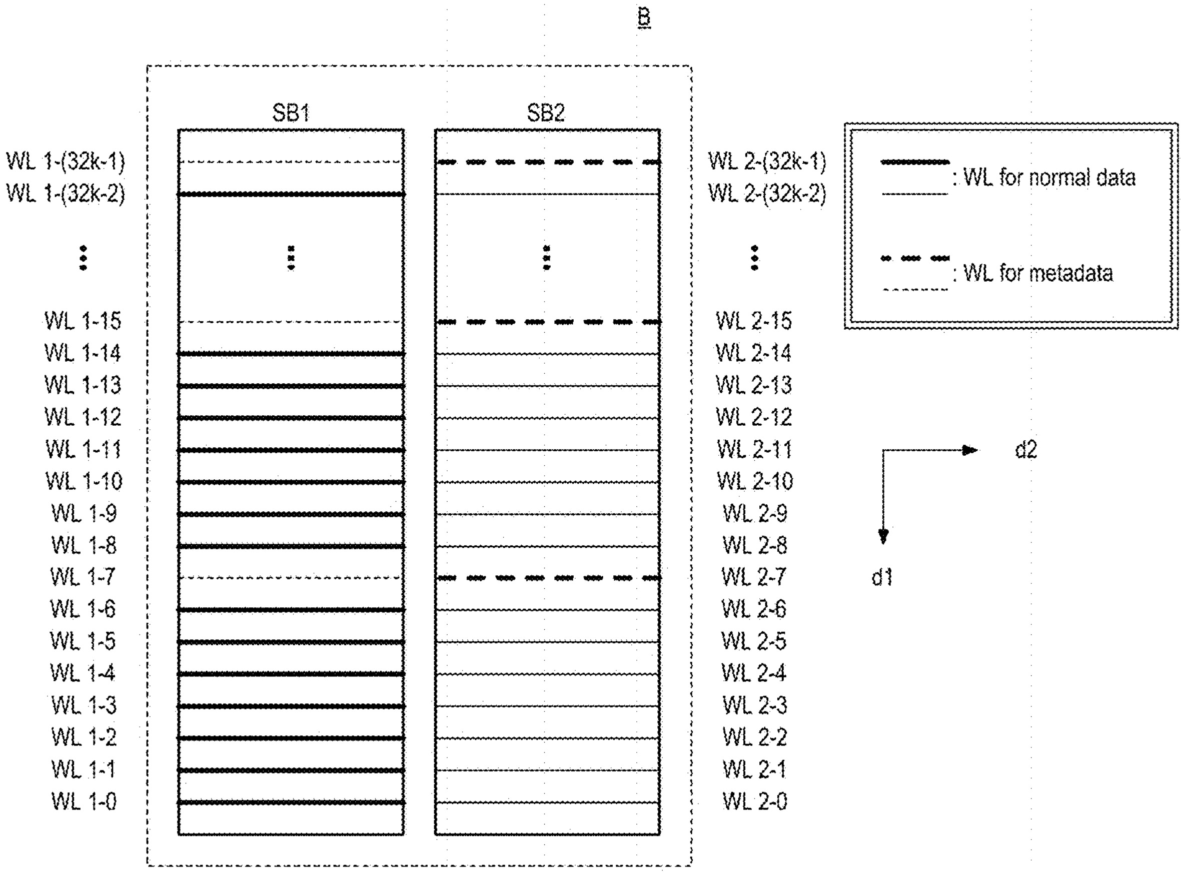
FIGS. 5 and 6 are diagrams illustrating a wordline allocation method.
Figure 6:
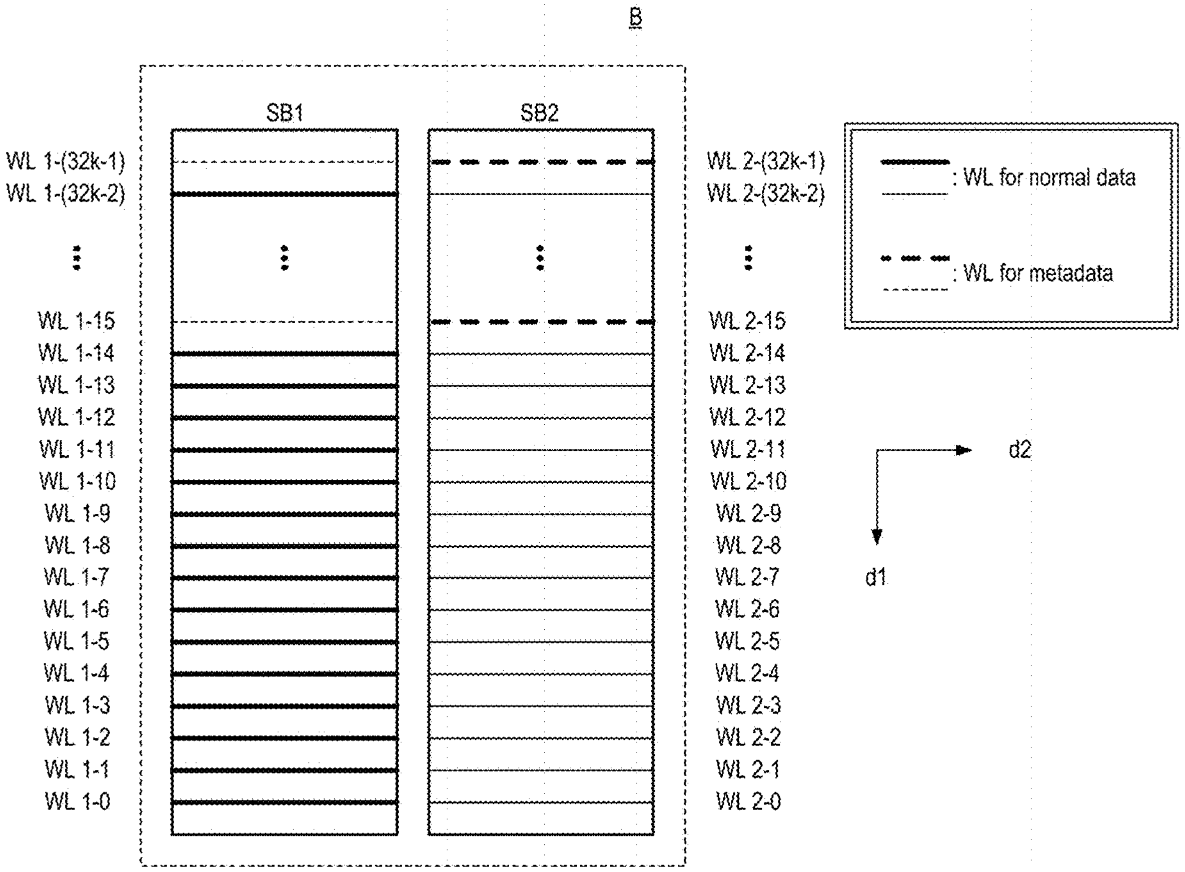

FIGS. 5 and 6 are diagrams illustrating a wordline allocation method according to an example implementation. As an example, FIG. 5 illustrates a case in which a required normal/meta ratio is n=8, and FIG. 6 illustrates a case in which a required normal/meta ratio is n=16. For example, a required ratio of wordlines allocated for normal data to wordlines allocated for metadata may be n:1. FIG. 5 illustrates an example that may correspond to a case in which a required normal/meta ratio 8:1, and FIG. 6 illustrates an example that may correspond to a case in which a required normal/meta ratio is 16:1.

Referring to FIGS. 5 and 6, a single bank B may be connected to a plurality of wordlines. In an example implementation, among the plurality of wordlines, every r-th wordline (where r is a positive integer) may be allocated for metadata in a column direction d1. For example, the remaining wordlines except for every r-th wordline may be allocated for normal data. According to example implementations, the wordlines allocated for metadata are not newly added, but a portion of wordlines already present in an existing memory device are allocated for this purpose. In an example implementation, a single bank (for example, a first bank B1) may include two subbanks (a first subbank SB1 and a second subbank SB2) divided in a row direction d2. The first subbank SB1 may be connected to a plurality of first wordlines WL1-0 to WL1-(32k−1) among the plurality of wordlines, and the second subbank SB2 may be connected to a plurality of second wordlines WL2-0 to WL2-(32k−1) among the plurality of wordlines. The number of the first wordlines and the second wordlines may be 32k (where k is, for example, 1024). In an example implementation, every r-th wordline connected to one subbank within a single bank B may be allocated for metadata of another subbank, and every r-th wordline connected to another subbank may be allocated for metadata of one subbank. In this case, the wordline allocated for metadata in one subbank may correspond to the wordline allocated for normal data in another subbank. For example, among the plurality of first wordlines WL1-0 to WL1-(32k−1) of the first subbank SB1, every r-th first wordline may be allocated for metadata for the second subbank SB2 in a column direction d1, and among the plurality of second wordlines WL2-0 to WL2-(32k−1) of the second subbank SB2, every r-th second wordline may be allocated for metadata for the first subbank SB1 in the column direction d1.

Allocating a wordline connected to one subbank for metadata of another subbank may refer to allocating the wordline for metadata corresponding to normal data to be written or read in another subbank. Therefore, according to an example implementation, wordlines for normal data and wordlines for metadata corresponding to the normal data may be provided to intersect each other in terms of a subbank.

Then, a ratio of the first wordline allocated for metadata among the first wordlines to the remaining first wordlines may be 1:(r−1), and a ratio of the second wordlines allocated for metadata among the second wordlines and the remaining second wordlines may be 1:(r−1).

For example, every r-th first wordline may be allocated to every 1st second wordline WL2-0 to every r-th second wordline WL2-(*r*−1) among the plurality of second wordlines WL2-0 to WL2-(32k−1). Every r-th second wordline may be allocated to every first wordline WL1-0 to every (r−1)-th wordline WL1-(*r*−1) among the plurality of first wordlines WL1-0 to WL1-(32k−1). For example, among the plurality of first wordlines WL1-0 to WL1-(32k−1) of the first subbank SB1, every r-th first wordline may be allocated to read or write metadata corresponding to normal data of every 1st second wordline to every (r−1)-th second wordline of the second subbank SB2 and among the plurality of second wordlines WL2-0 to WL2-(32k−1) of the second subbank SB2, every r-th first wordline may be allocated to read or write metadata corresponding to normal data of every 1st first wordline to every (r−1)-th first wordline.

For example, when n is 8 as illustrated in FIG. 5, r may be 8. For example, referring to FIG. 5, when a required ratio of wordlines allocated for normal data and wordlines allocated for metadata is 8:1, every eighth wordline may be allocated for metadata. Then, every eighth wordline may be allocated for metadata, and every first wordline to every seventh wordline may be allocated for normal data. Accordingly, a ratio of normal data wordlines to metadata wordlines may be 7:1.

According to FIG. 5, to support the case in which a required ratio of wordlines allocated for normal data to wordlines allocated for metadata is 8:1, every eighth wordline of one subbank may be allocated to read or write metadata corresponding to normal data of every first to eighth wordlines of another subbank. For example, 1-0-th to 1-6-th wordlines WL1-0 to WL1-6 of the first subbank SB1 may be allocated for normal data, and a 2-7-th wordline WL2-7 may be allocated to read and write metadata corresponding to normal data written in or read from 1-0-th to 1-6-th wordlines WL1-0 to WL1-6 of the first subbank SB1. In contrast, 2-0-th to 2-6-th wordlines WL2-0 to WL2-6 of the second subbank SB2 may be allocated for normal data, and a 1-7-th wordline WL1-7 of the first subbank SB1 may be allocated to read and write metadata corresponding to normal data written in or read from 2-0-th to 2-7-th wordlines WL2-0 to WL2-6 of the second subbank SB2. As a result, in the 1-0-th to 1-7-th wordline WL1-0 to WL1-7 of the first subbank SB1 (or the 2-0-th to 2-7-th wordline WL2-0 to WL2-7 of the second subbank SB2), a ratio of normal data to metadata may be 7:1. The above-described allocation relationship may be repeated from last wordlines (for example, a 1-(32k−1)-th wordline WL1-(32k−1) and a 2-(32k−1)-th wordline WL2-(32k)) in a column direction.

Referring to FIG. 6, when n is 16, r may be 16. For example, referring to FIG. 6, when a required ratio of wordlines allocated for normal data and wordlines allocated for metadata is 16:1, every sixteenth wordline may be allocated for metadata. Then, every sixteenth wordline may be allocated for metadata, and every first wordline to every fifteenth wordline may be allocated for normal data. Therefore, a ratio of normal data wordlines and metadata wordlines may be 15:1.

According to FIG. 6, to support the case in which a required ratio of wordlines allocated for normal data to wordlines allocated for metadata is 16:1, every sixteenth wordline of one subbank may be allocated to read or write metadata corresponding to normal data of every first wordline to every fifteenth wordline of another subbank. For example, 1-0-th to 1-14-th wordlines WL1-0 to WL1-14 of the first subbank SB1 may be allocated for normal data, and a 2-15-th wordline WL2-15 of the second subbank SB2 may be allocated to read and write metadata corresponding to normal data written in or read from 1-0-th to 1-14-th wordlines WL1-0 to WL1-14 of the first subbank SB1. In contrast, 2-0-th to 2-14-th wordlines WL2-0 to WL2-14 of the second subbank SB2 may be allocated for normal data, and a 1-15-th wordline WL1-15 of the first subbank SB1 may be allocated to read and write metadata corresponding to normal data written in or read from 2-0-th to 2-14-th wordlines WL2-0 to WL2-14 of the second subbank SB2. As a result, in the 1-0-th to 1-15-th wordline WL1-0 to WL1-15 of the first subbank SB1 (or the 2-0-th to 2-15-th wordlines WL2-0 to WL2-15 of the second subbank SB2), a ratio of normal data and metadata may be 15:1. The above-described allocation relationship may be repeated last wordlines (for example, a 1-(32k−1)-th wordline WL1-(32k−1) and a 2-(32k−1) wordline WL2-(32k−1)) in a column direction.

According to the above-described implementations, a portion of existing wordlines may be allocated for metadata to significantly satisfy a required normal/meta ratio without addition of new lines. For example, an allocation relationship between normal data wordlines and metadata wordlines may be established to intersect between subbanks, and thus normal data and metadata may be simultaneously output.

In this case, a single bank (for example, the first bank B1), divided into the first subbank SB1 and the second subbank SB2, represented by the example implementations of FIGS. 5 and 6 may operate in the same functional manner as a bank that is not divided into subbanks. For example, the first subbank SB1 is internally connected to the plurality of first wordlines WL1-0 to WL1-(32k−1) and the second subbank SB2 is internally connected to the plurality of second wordlines WL1-0 to WL1-(32k−1), which may operate in the same manner as a single bank connected to a total of 64k wordlines (for example, WL0 to WL(64k−1)). For example, the plurality of first wordlines WL1-0 to WL1-(32k−1) and the plurality of second wordlines WL2-0 to WL2-(32k−1) may correspond to first to 32k-th wordlines WL0 to WL(32k−1) and 32k+1-th to 64k-th wordlines WL32*k* to WL(64k−1) among the total of 64k wordlines (for example, WL0 to WL(64k−1)), respectively. Accordingly, in the example implementation of FIG. 5, the first subbank SB1 connected to the plurality of first wordlines WL1-0 to WL1-(32k−1) and the second subbank SB2 connected to the plurality of second wordlines WL2-0 to WL2-(32k−1) may correspond to a portion connected to former 32k wordlines (for example, WL0 to WL(32k−1)) in a bank without a subbank structure and a portion connected to latter 32k wordlines (for example, WL32*k* to WL(64k−1)), respectively.

The number of wordlines according to the above-described example implementations of FIGS. 5 and 6 are only examples, and may be set in a variety of ways depending on memory capacity. For example, when the number of rows that are capable of being selected by each of the first row decoder RD1 and the second row decoder RD2 according to the above-described example implementations is N (where N is a positive integer), the first subbank SB1 may be connected to N first wordlines and the second subbank SB2 may be connected to N second wordlines. Accordingly, the first subbank SB1 and the second subbank SB2 may operate in the same manner as a single bank connected to a total of 2N wordlines. Hereinafter, for ease of description, an example will be provided in which the number of wordlines in each subbank is 32k.

Figure 7:
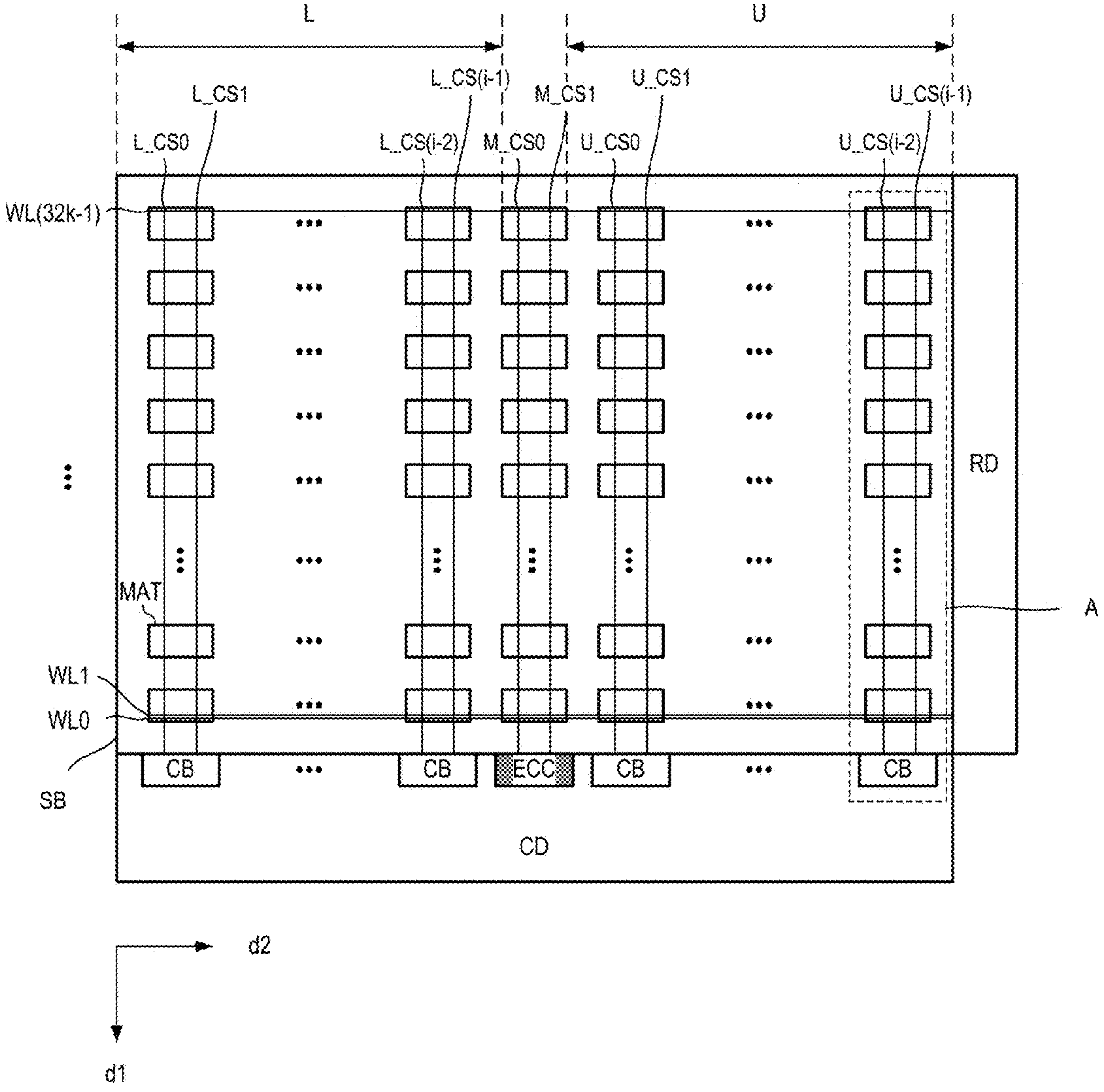
FIG. 7 is a diagram illustrating an example subbank.

FIG. 7 is a diagram illustrating a subbank according to an example implementation.

Referring to FIG. 7, a subbank SB according to an example implementation may correspond to one of the subbanks SB included in a single bank described above in FIGS. 2 to 6, and may be connected to a plurality of wordlines WL0 to WL(32k−1) extending in a row direction d2, a plurality of CSL subsets L_CS0 to U_CS(i−1) extending in a column direction d1, and a row decoder RD and a column decoder CD. The subbank SB may include a plurality of mats MAT. Some wordlines and some CSLs may be connected to each of the mats MAT. A MAT may include an array of memory cells arranged two-dimensionally, and each of the memory cells may be connected to a single wordline, among some wordlines connected to a corresponding MAT, and a single CSL among some CSLs.

In an example implementation, a column decoder CD connected to each subbank SB may include a plurality of CSL blocks CB and a single error correction code (ECC) block. Each of the CSL blocks CB and the ECC block may be configured to select a CSL based on a column address decoded from the column decoder CD. The CSL block CB and the ECC block may be arranged in a row direction d2 corresponding to the CSL. For example, among the plurality of MATs, MATs connected to a column corresponding to the ECC block may store parity bits generated from the ECC block.

In an example implementation, the ECC block may be disposed to correspond to a middle column among a plurality of columns formed by the plurality of MATs included in the subbank SB. For example, for a single subbank SB, a plurality of CSL blocks CB may be arranged symmetrically with respect to the ECC block. Accordingly, CSLs connected to the plurality of CSL blocks CB may also be arranged symmetrically with respect to the CSLs connected to the ECC block.

The plurality of CSL subsets L_CS0 to U_CS(i−1) may be connected to a plurality of MATs corresponding to a single CSL block CB. As illustrated in the drawing, a pair of CSL subsets may be selected from among the plurality of CSL subsets L_CS0 to U_CS(i−1) during a single access. For example, a pair of CSL subsets L_CS(i−2) and L_CS(i−1) (where, i is a positive integer) may be selected from a pair of CSL subsets L_CS0 and L_CS1 at a first side L with respect to the ECC block, and a pair of CSL subsets U_CS(i−2) and U_CS(i−1) may be selected from a pair of CSL subset U_CS0 and U_CS1 at a second side U with respect to the ECC block. In addition, a pair of CSL subsets M_CS0 and M_CS1 may be selected in the ECC block.

Figures 8, 9:
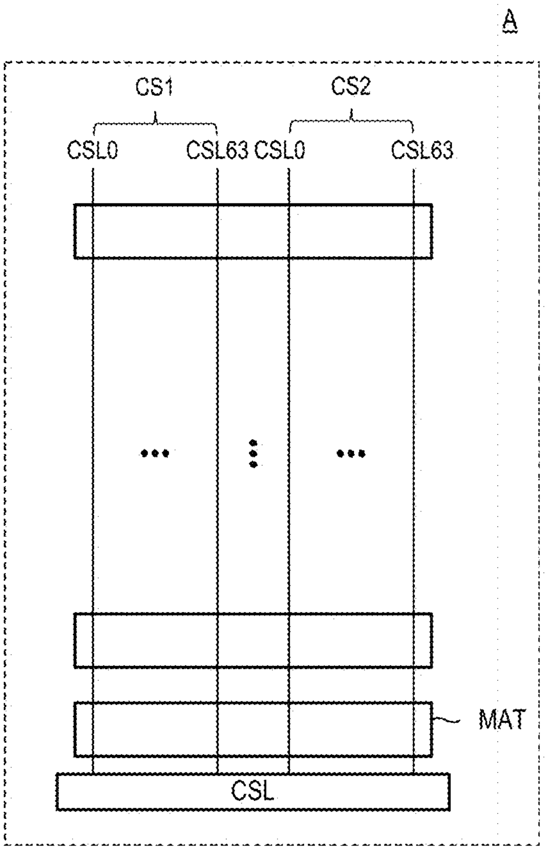

FIG. 8 is a diagram illustrating an example of region "A" of FIG. 7.

Referring to FIG. 8, for example, a plurality of CSLs that may be classified into CSL groups CS1 and CS2 may be connected to a plurality of MATs corresponding to a single CSL block CB. A portion of the plurality of CSLs may be connected to each of the CSL groups CS1 and CS2. As an example, a plurality of CSLs, for example, 64 CSLs CSL0 to CSL63 as illustrated, may be connected to each of the CSL groups CS1 and CS2. Accordingly, a total of 128 CSLs may be connected to a single CSL block CB. During a single access, a single CSL may be selected from each of the CSL groups CS1 and CS2. Hereinafter, unless otherwise specified, a CSL selected from the CSL groups CS1 and CS2 for each CSL block CB and ECC block in a single subbank SB will be referred to as a CSL subset, and a CSL selected for each CSL block CB will be referred to as a pair of CSL subsets.

Returning to FIG. 7, a pair of CSL subsets or a portion of the pair of CSL subsets corresponding to a single CSL block CB included in a single subbank SB may be allocated to a single wordline among wordlines connected to remaining subbanks constituting a bank together with the single subbank SB, for example, a single wordline among wordlines for normal data. For example, all CSL subsets included in the single subbank SB may each be allocated to one of the normal data wordlines connected to the remaining subbanks. According to an example implementation, referring to FIG. 6, the single subbank SB may correspond to the first subbank SB1 of FIG. 6, and the remaining subbanks may correspond to the second subbank SB2 of FIG. 6.

For example, a single bank may include one subbank SB and another subbank. In this case, when an access to normal data is performed through remaining wordlines, other than every r-th wordline, in one subbank SB, an access to metadata may be performed on every r-th wordline in another subbank. In this case, a pair of CSL subsets in another subbank or a portion of the pair of CSL subsets may be allocated to each of the remaining wordlines of the single subbank SB. Accordingly, when the access to normal data is performed on one of the remaining wordlines of the single subbank SB is performed, an access to metadata may be performed on the pair of CSL subsets or a portion of the pair of CSL subsets allocated to one of the remaining wordlines.

All CSL subsets may be selected in a normal-side subbank SB in which an access to normal data is performed. Accordingly, the access to normal data may be performed on the normal data wordline and all of the CSL subsets.

In an example implementation, a pair of CSL subsets L_CS0, L_CS1 to L_CS(i−2), and L_CS(i−1) included in the first side L, among the CSL subsets connected to the single subbank SB, and a pair of CSL subsets U_CS0, U_CS1 to U_CS(i−2), and U_CS(i−1) included in the second side U may be sequentially allocated from a pair of CSL subsets having a lowest index to the normal data wordline connected to the remaining subbanks SB.

In an example implementation, among the CSL subsets connected to the single subbank SB, the CSL subsets L_CS0 to L_CS(i−1) included in the first side L and the CSL subsets U_CS0 to U_CS(i−1) included in the second side U may be sequentially assigned from a CSL subset having a lowest index to the normal data wordlines connected to the remaining subbanks SB.

FIGS. 9 and 10 are diagrams illustrating column select signals of normal data and metadata according to various embodiments. FIGS. 9 and 10 illustrate an example implementation of a combination of meta-side subbank (MSB)-side column select signals corresponding to normal-side subbank (NSB)-side column select signals. Although the distinction between NSB and MSB is based on a location in which normal data is stored, each subbank may be regarded as an NSB and an MSB based on an opposite subbank. For example, referring to FIG. 6, when a first subbank SB1 is an NSB, an MSB may be a second subbank SB2. In addition, when the SB2 is an NSB, an MSB may be a first subbank SB1.

In FIGS. 9 and 10, CSLx[m:n] may be defined as a column select signal, a signal for selecting a CSL. The column select signal may be generated through a column decoder.

Here, m and n represent a range of a CSL subset to be selected from among the plurality of CSL subsets allocated to a single bank (or subbank) and are also positive integers. For example, m represents a lowest index among indices of the CSL subsets to be selected, and n represents a highest index among the indices of the CSL subsets to be selected.

The column decoder may select m-th to n-th CSL subsets from the CSL subsets on each of the first and second sides for a single bank (or subbank) based on CSLx[m:n], and may select an x-th CSL from a plurality of CSLs corresponding to the selected CSL subsets. For example, when m=0 and n=1 in FIG. 7, the column decoder may select L_CS0 and L_CS1 on the first side L and select U_CS0 and U_CS1 on the second side U.

Here, x represents an index of a CSL to be selected from among a plurality of CSLs included in each pair of CSL subsets in FIG. 8 and is a positive integer. Referring to FIG. 8, for example, when x=1, CSL1 may be selected from CS1 and CSL1 may be selected from CS2.

Returning to FIG. 9, for example, when a required normal/meta ratio is 8, every eighth wordline may be allocated for metadata according to an example implementation. For example, a ratio of wordlines allocated for normal data to wordlines allocated for metadata may be actually 7:1. This is aimed at significantly satisfying the required ratio of 8:1 without additional chip size overhead.

In terms of the normal-side subbank NSB, an access to normal data may be performed on each of the first to seventh wordlines WL0 to WL6. In this case, the column select signal for the normal-side subbank NSB may be CSLx[0:15] to select all CSL subsets, and a value of x may range from 0 to 63, as illustrated in FIG. 9. The eighth wordline WL7 of the normal-side subbank NSB may be allocated for the meta-side subbank MSB.

Next, in terms of the meta-side subbank MSB, the eighth wordline WL7 may be allocated for the normal-side subbank NSB. In this case, the column select signal may be defined based on a wordline accessed in the normal-side subbank NSB. For example, according to the above-described implementation, a pair of CSL subsets of the meta-side subbank MSB may be sequentially allocated to a normal data wordline connected to the normal-side subbank NSB. For example, when the first wordline WL0 of the normal-side subbank NSB is accessed, m and n of the column select signal may be determined to be respectively 0 and 1 to select a pair of CSL subsets having the lowest index. Next, when the second wordline WL1 of the normal-side subbank NSB is accessed, m and n of the column select signal may be determined to be respectively 2 and 3 to select a pair of CSL subsets having the next index. When the last sixth wordline WL6 is accessed, m and n of the column select signal may be determined to be respectively 12 and 13 based on the above-described allocation relationship. According to the above-described implementation, the fifteenth and sixteenth CSL subsets on the meta side may not be allocated.

According to the above-described column select signal of FIG. 9, for example, when eight bitlines are connected per CSL, 256 bits of normal data (8 bits×32 (the number of CSL subsets selected in the normal-side subbank NSB)), 32 bits of normal data (8 bits×4 (the number of CSL subsets selected in the meta-side subbank MSB)), and 16 bits of parity bits may be output during an access to a single wordline.

Referring to FIG. 10, for example, when a required normal/meta ratio is 16, every sixteenth wordline may be allocated for metadata according to an example implementation. For example, a ratio of wordlines allocated for normal data and wordlines allocated for metadata may be actually 15:1. This is aimed at significantly satisfying the required ratio of 16:1 without additional chip size overhead.

In terms of the normal-side subbank NSB, an access to normal data may be performed on each of the first to fifteenth wordlines WL0 to WL14. As described above, a column select signal for the normal-side subbank NSB may be CSLx[0:15] to select all CSL subsets. Similarly, the sixteenth wordline WL15 of the normal-side subbank NSB may be allocated for the meta-side subbank MSB.

Next, in terms of the meta-side subbank MSB, the sixteenth wordline WL15 may be allocated for the normal-side subbank NSB. For example, according to the above-described implementation, the CSL subsets of the meta-side subbank MSB may be sequentially assigned from the CSL subset having the lowest index to the normal data wordline for normal data connected to the normal-side subbank NSB. Unlike FIG. 9, only one CSL subset is selected, so that a column select signal of the meta-side subbank MSB may be defined as CSLx[m].

For example, when the first wordline WL0 of the normal-side subbank NSB is accessed, m of the column select signal may be determined to be 0 to select the CSL subset having the lowest index. Next, when the second wordline WL1 of the normal-side subbank NSB is accessed, m of the column select signal may be determined to be 1 to select the CSL subset having the next index. According to the above-described allocation relationship, when the last fifteenth wordline WL14 is accessed, m of the column select signal may be determined to be 15. According to the above-described implementation, the sixteenth CSL subset on the meta side may not be allocated.

According to the above-described column select signal of FIG. 10, for example, when eight bitlines are connected per CSL, 256 bits of normal data (8 bits×32 (the number of CSL selected in the normal-side subbank NSB)), 16 bits of metadata (8 bits×2 (the number of CSL subsets selected in the meta-side subbank MSB)), and 16 bits of parity bits may be output during an access to a single wordline.

Hereinafter, in FIGS. 11 to 34, various implementations of an allocation relationship between a wordline and a CSL will be described based on the example implementations illustrated in FIGS. 7 to 10. Unless otherwise specified, a symbol 'L' denoting a CSL subset may be defined as meaning the first side L of FIG. 7, and 'U' may be defined as meaning the second side U of FIG. 7. FIGS. 11 to 22 illustrate example implementations when a required normal/meta ratio is 8 (for example, when r=8), and FIGS. 23 to 34 illustrate example implementations when a required normal/meta ratio is 16 (for example, when r=16).

Figure 11:
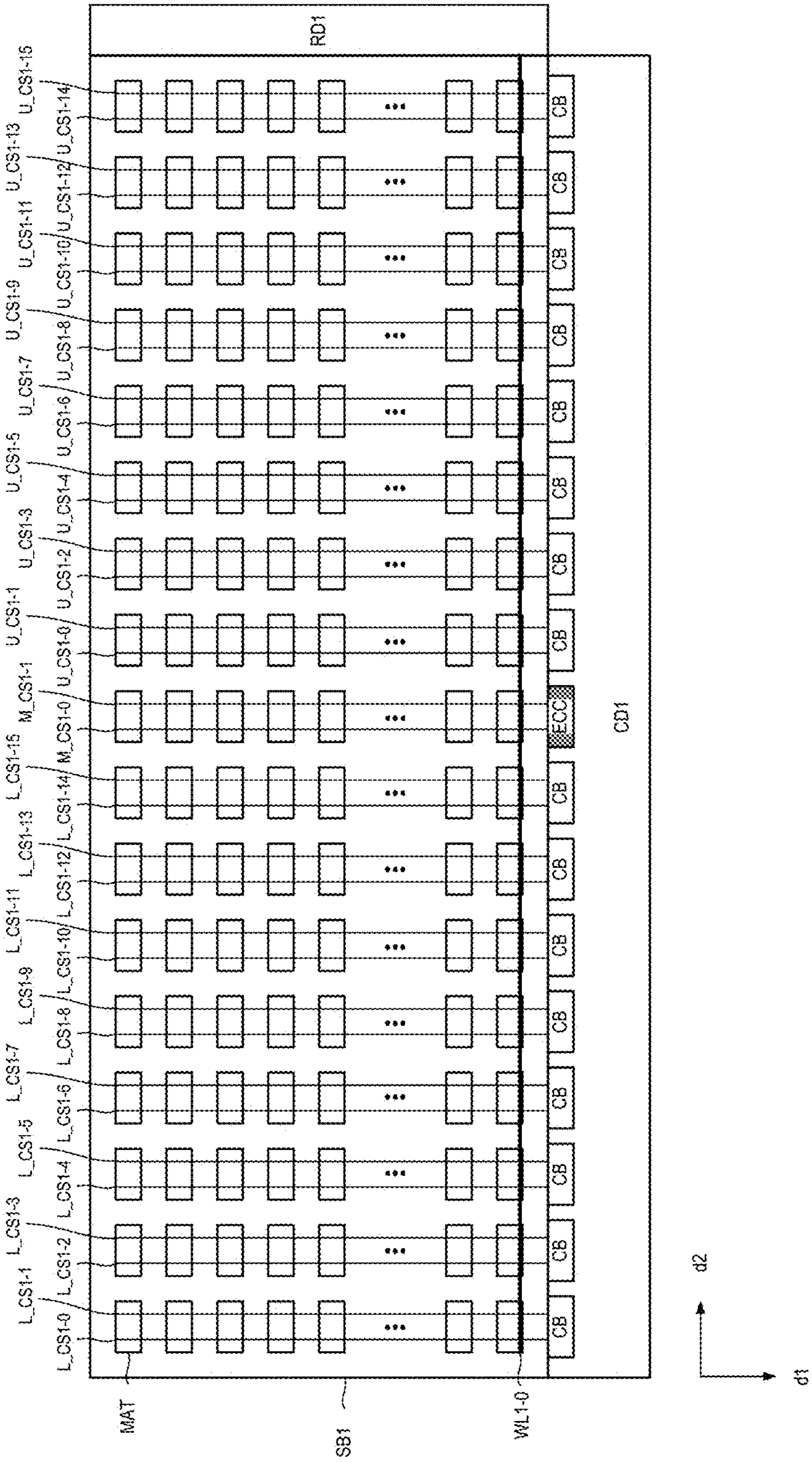
FIGS. 11 and 12 are diagrams illustrating an allocation relationship between a first wordline and a column select line (CSL) when a first subbank is a normal-side subbank.
Figure 12:
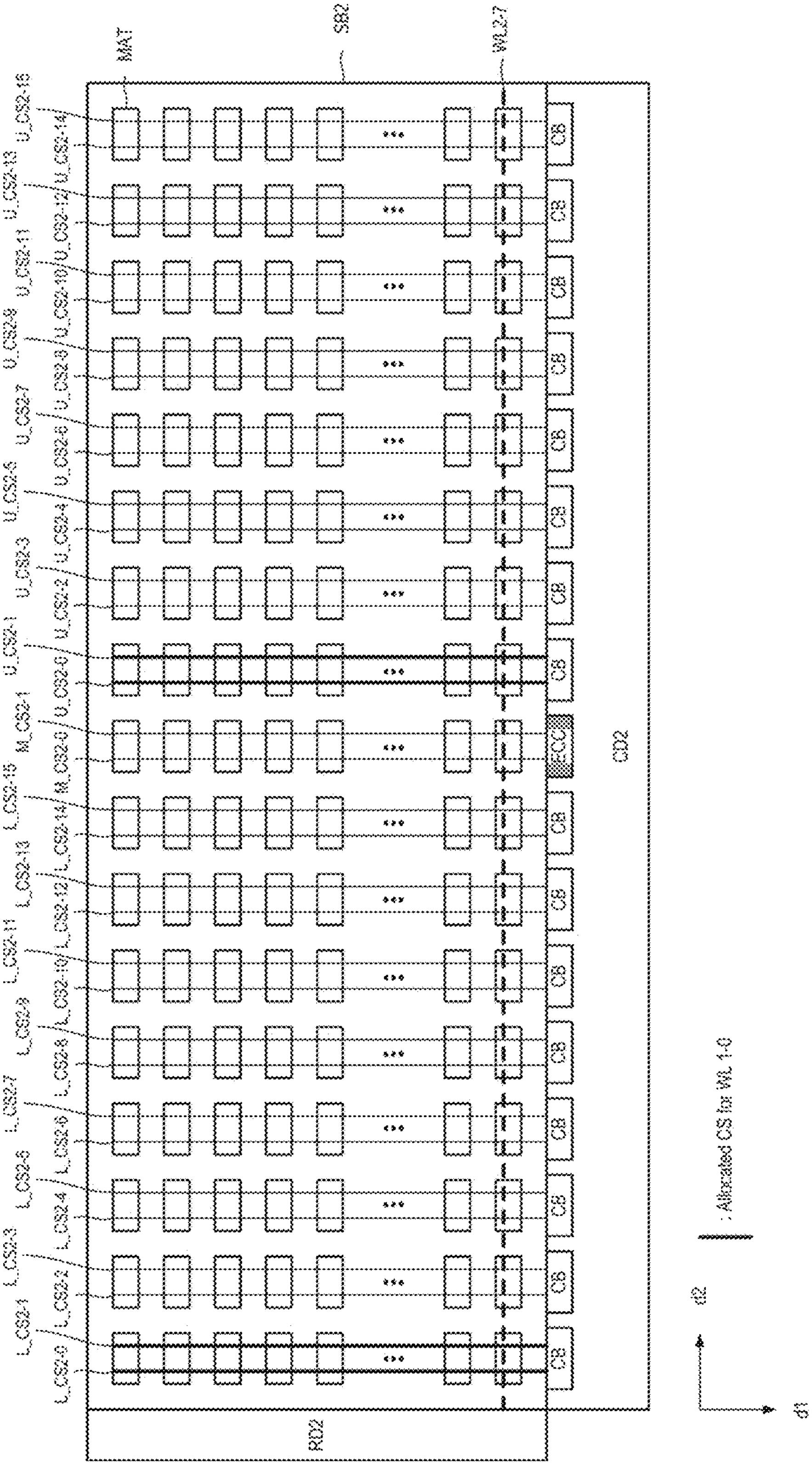

FIGS. 11 and 12 are diagram illustrating an allocation relationship between a first wordline and a CSL when a first subbank SB1 is a normal-side subbank.

Referring to FIG. 11, the first subbank SB1 may include a plurality of MATs and may be connected to a plurality of first CSL subsets L_CS1-0 to U_CS1-15. Referring to FIG. 12, a second subbank SB2 may include a plurality of MATs and may be connected to a plurality of second CSL subsets L_CS2-0 to U_CS2-15. In this case, ECC CSL subsets M_CS1-0 and M_CS1-1, among the first CSL subsets L_CS1-0 to U_CS1-15, may be connected to an ECC block of the first subbank SB1, and first and second-side CSL subsets L_CS1-0 to U_CS1-15 may be connected to each CSL block CB. In addition, ECC CSL subsets M_CS2-0 and M_CS2-1, among the second CSL subsets L_CS2-0 to U_CS2-15, may be connected to an ECC block of the second subbank SB2, and first and second-side CSL subsets L_CS2-0 to U_CS2-15 may be connected to each CSL CB. The plurality of first CSL subsets L_CS1-0 to U_CS1-15 and the plurality of second CSL subsets L_CS2-0 to U_CS2-15 may each be selected for each CSL block CB of FIG. 8 based on a column select signal in the plurality of CSLs.

According to an example implementation, every r-th wordline of the first subbank SB1 and the second subbank SB2 may be allocated for metadata. For example, when r=8, a 1st first wordline WL1-0 may be selected through the first row decoder RD1 connected to the first subbank SB1 to read or write normal data. In this case, an 8th second wordline WL2-7 may be selected through the second row decoder RD2 connected to the second subbank SB2 to read or write metadata corresponding to the normal data.

In addition, a pair of first-side CSL subsets L_CS2-0 and L_CS2-1 and a pair of second-side CSL subsets U_CS2-0 and U_CS2-1, among the second CSL subsets L_CS2-0 to U_CS2-15, may be allocated to the 1st first wordline WL1-0.

Then, the first column decoder CD1 may select all of the CSL subsets L_CS1-0 to U_CS1-15 for the first subbank SB1 that is a normal-side subbank, and the second column decoder CD2 may select a pair of first-side CSL subsets L_CS2-0 and L_CS2-1 and a pair of second-side CSL subsets U_CS2-0 and U_CS2, allocated for metadata, for the second subbank SB2 that is a meta-side subbank. In this case, a column select signal for selecting a CSL subset may be CSLx[0:15] (where x is one of 0 to 63) generated from the first column decoder CD1, and may be CSLx[0:1] (where x is one of 0 to 63) generated from the second column decoder CD2.

Accordingly, from the first subbank SB1 that is a normal-side subbank, normal data may be output from the 1st first wordline WL1-0 and the plurality of CSL subsets L_CS1-0 to U_CS1-15. In addition, from the second subbank SB2 that is a meta-side subbank, metadata corresponding to the normal data may be simultaneously output from the 8th second wordline WL2-7, the pair of first-side CSL subsets L_CS2-0 and L_CS2-1, and the pair of second-side CSL subsets U_CS2-0 and U_CS2-1.

Figure 13:
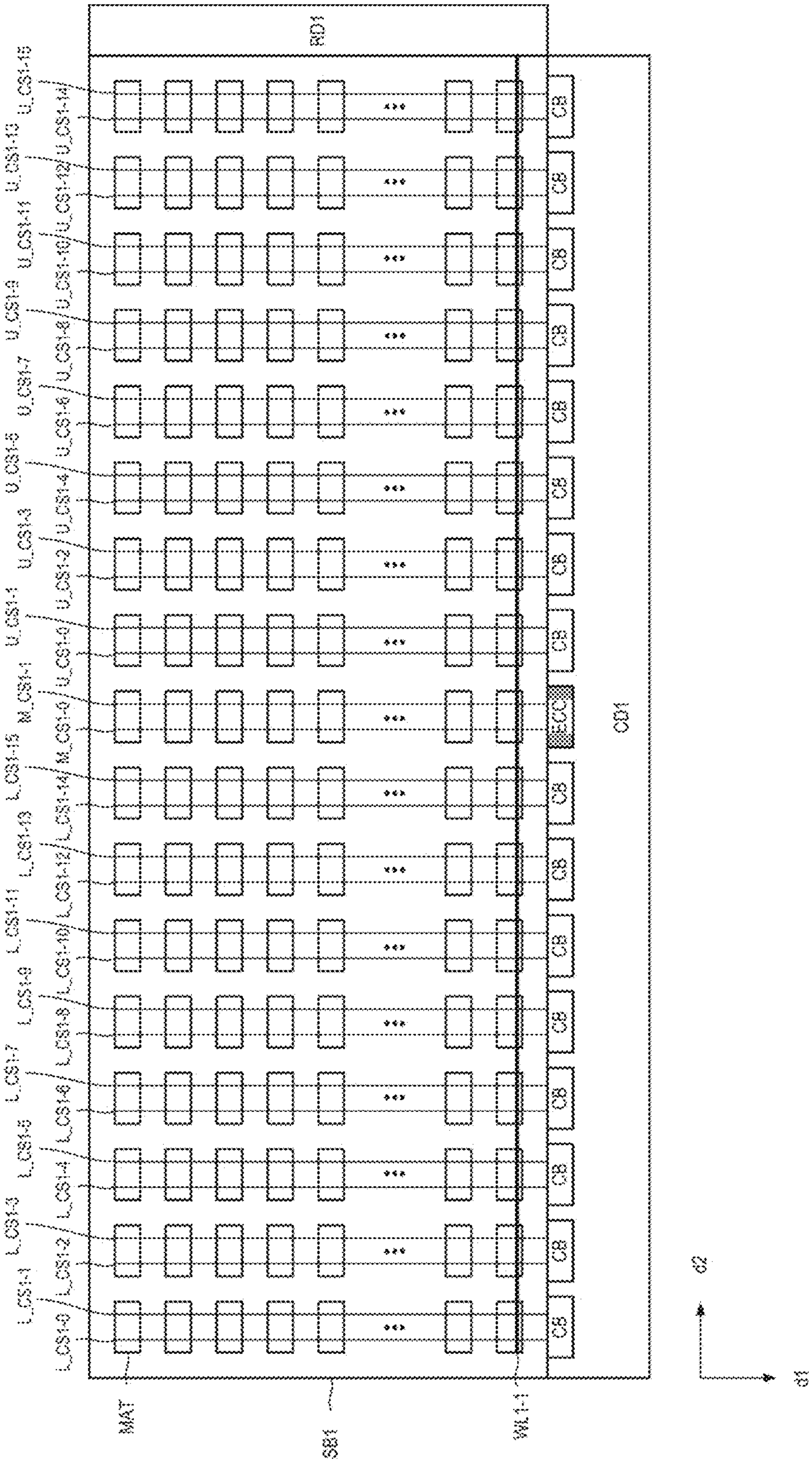
FIGS. 13 and 14 are diagrams illustrating an allocation relationship between a second wordline and a CSL when a first subbank is a normal-side subbank.
Figure 14:
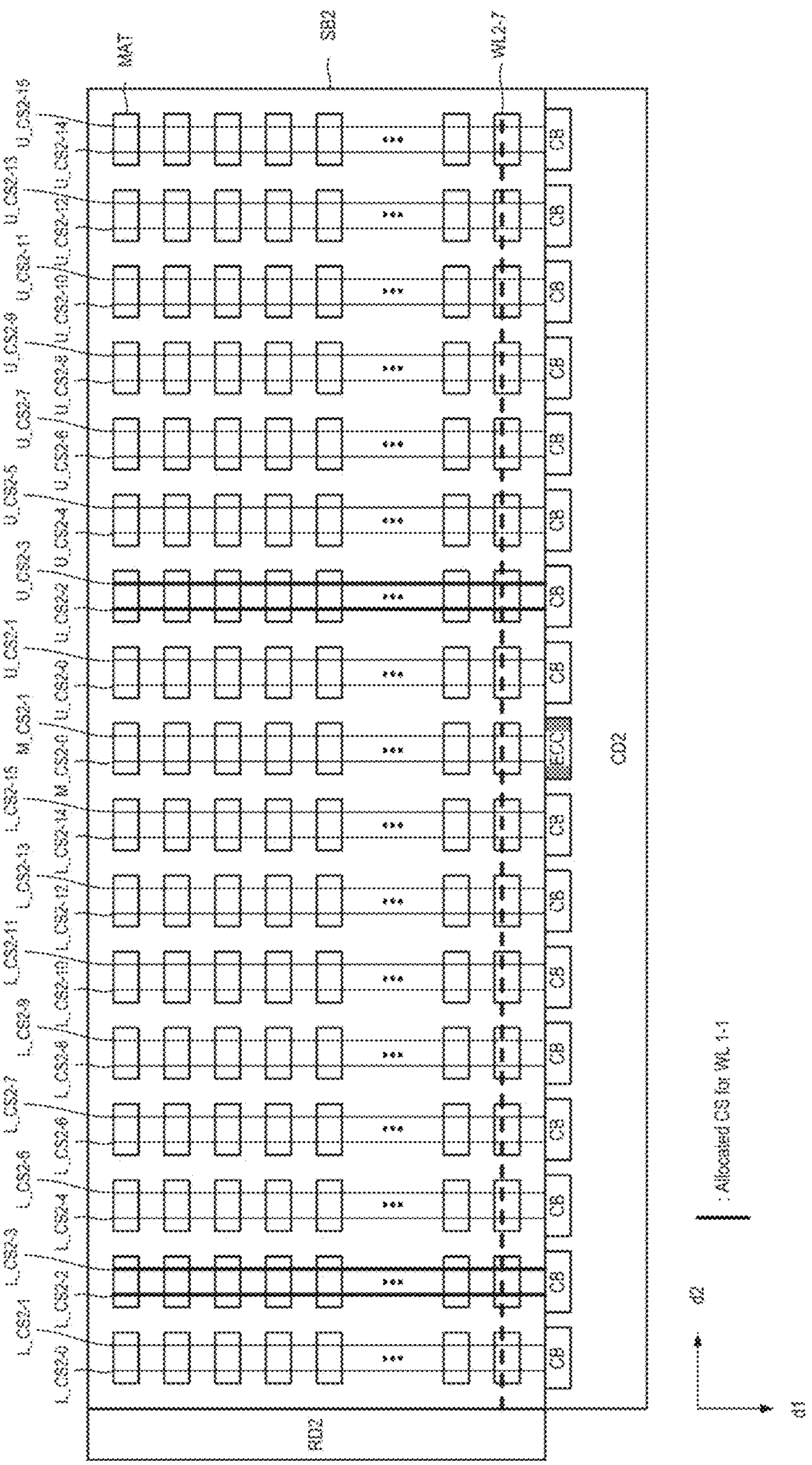

FIGS. 13 and 14 are diagrams illustrating an allocation relationship between a second wordline and a CSL when a first subbank SB1 is a normal-side subbank.

Referring to FIGS. 13 and 14, when a 2nd first wordline WL1-1 is selected through the first row decoder RD1 connected to the first subbank SB1 to read or write normal data, an 8th second wordline WL2-7 may also be selected through the second row decoder RD2 connected to the second subbank SB2 to read or write metadata corresponding to the normal data.

A pair of first-side CSL subsets L_CS2-2 and L_CS2-3 and a pair of second-side CSL subsets U_CS2-2 and U_CS2-3, among second CSL subsets L_CS2-0 to U_CS2-15, may be allocated to a 2nd first wordline WL1-1.

Then, the first column decoder CD1 may select all of the CSL subsets L_CS1-0 to U_CS1-15 for the first subbank SB1 that is a normal-side subbank, and the second column decoder CD2 may select a pair of first-side CSL subsets L_CS2-2 and L_CS2-3 and a pair of second-side CSL subsets U_CS2-2 and U_CS2, allocated for metadata, for a second subbank SB2 that is a meta-side subbank. In this case, a column select signal for selecting a CSL subset may be CSLx[0:15] (where x is one of 0 to 63) generated from the first column decoder CD1, and may be CSLx[2:3] (where x is one of 0 to 63) generated from the second column decoder CD2.

Accordingly, from the first subbank SB1 that is a normal-side subbank, normal data may be output from a 2nd first wordline WL1-1 and a plurality of first CSL subsets L_CS1-0 to U_CS1-15. In addition, from the second subbank SB2 that is a meta-side subbank, metadata corresponding to the normal data may be simultaneously output from an 8th second wordline WL2-7, a pair of first-side CSL subsets L_CS2-2 and L_CS2-3, and a pair of second-side subsets U_CS2-2 and U_CS2-3.

Every pair of CSL subsets of the second subbank SB2 may be sequentially allocated from a 3rd first wordline to a last wordline of the first subbank SB1.

Figure 15:
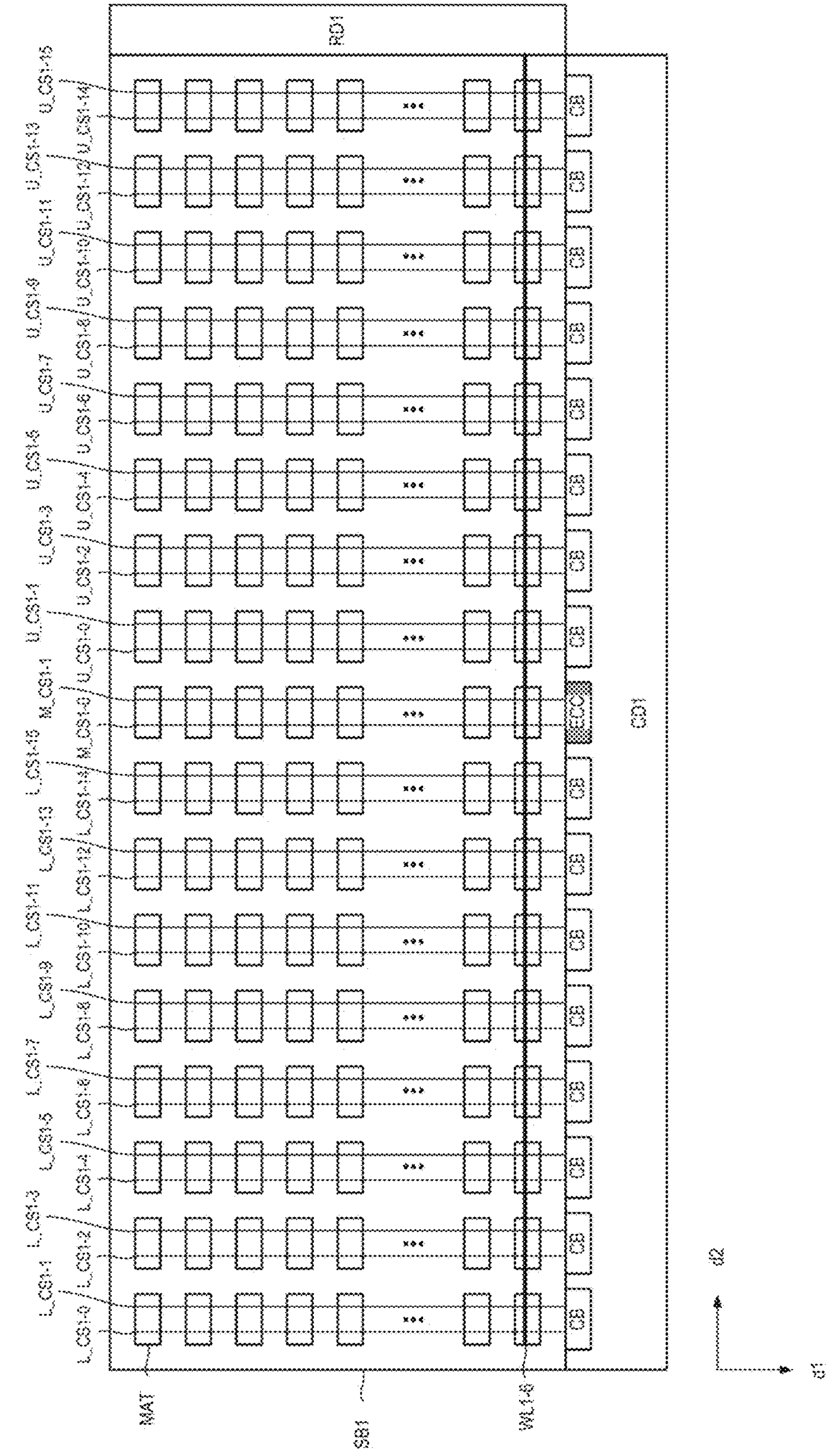
FIGS. 15 and 16 are diagrams illustrating an allocation relationship between a last wordline and a CSL when a first subbank is a normal-side subbank.
Figure 16:
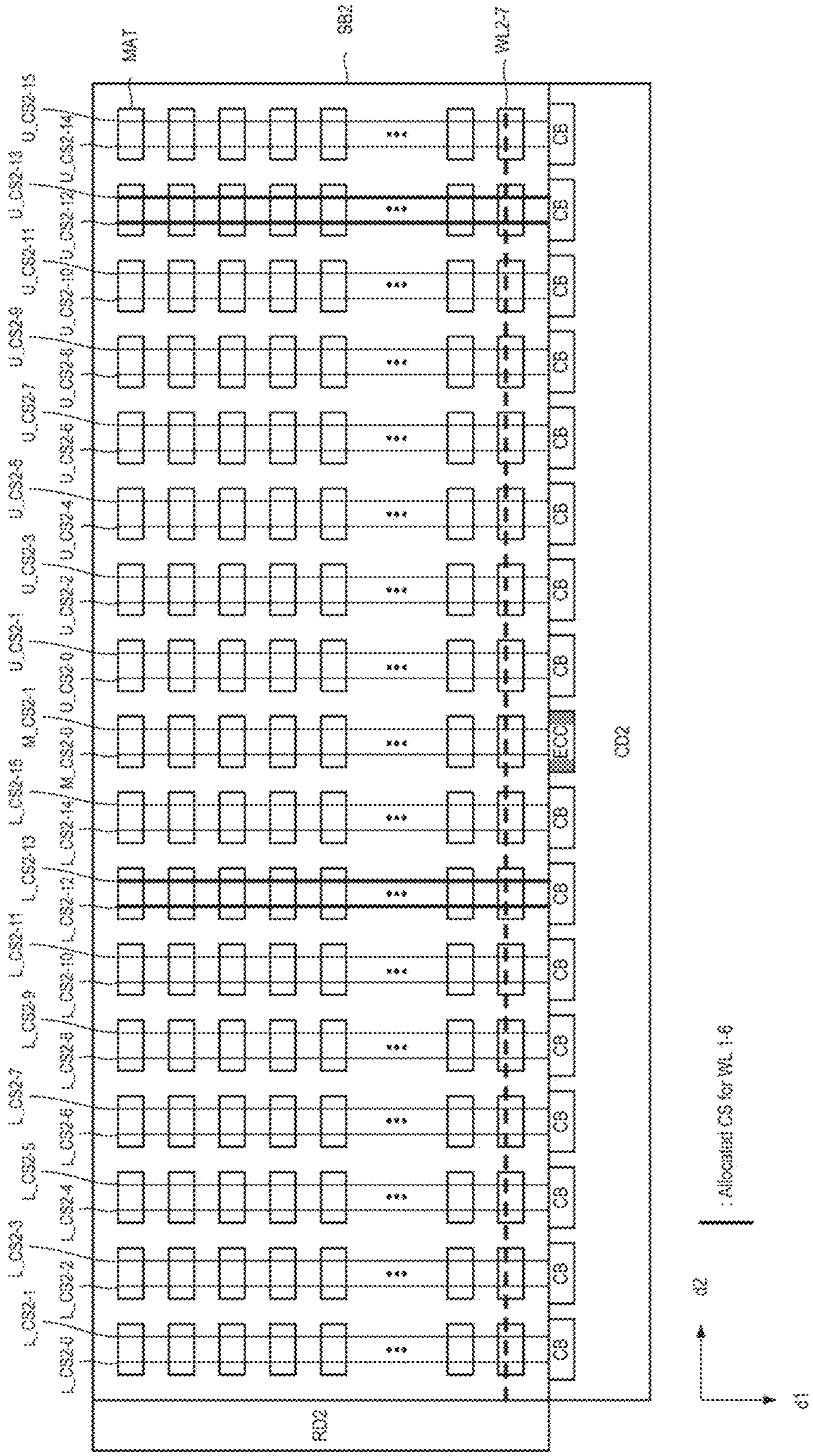

FIGS. 15 and 16 are diagrams illustrating an allocation relationship between a last wordline and a CSL when a first subbank SB1 is a normal-side subbank, according to an embodiment.

Referring to FIGS. 15 and 16, when a 7th first wordline WL1-6 is selected through the first row decoder RD1 connected to the first subbank SB1 to read or write normal data, an 8th second wordline WL2-7 may also be selected through the second row decoder RD2 connected to the second subbank SB2 to read or write metadata corresponding to the normal data.

The first column decoder CD1 may select all of the CSL subsets L_CS1-0 to U_CS1-15 for the first subbank SB1 that is a normal-side subbank, and the second column decoder CD2 may select a pair of first-side CSL subsets L_CS2-12 and L_CS2-13 and a pair of second-side CSL subsets U_CS2-12 and U_CS2-13, allocated for metadata, for a second subbank SB2 that is a meta-side subbank. In this case, a column select signal for selecting a CSL subset may be CSLx[0:15] (where x is one of 0 to 63) generated from the first column decoder CD1, and may be CSLx[12:13] (where x is one of 0 to 63) generated from the second column decoder CD2.

Accordingly, from the first subbank SB1 that is a normal-side subbank, normal data may be output from a 7th first wordline WL1-6 and a plurality of first CSL subsets L_CS1-0 to U_CS1-15. In addition, from the second subbank SB2 that is a meta-side subbank, metadata corresponding to the normal data may be simultaneously output from an 8th second wordline WL2-7, a pair of first-side CSL subsets L_CS2-12 and L_CS2-13, and a pair of second-side subsets U_CS2-12 and U_CS2-13.

In this case, the pair of CSL subsets L_CS2-14, L_CS2-15, U_CS2-14, and U_CS2-15 corresponding to CSLx[14:15] in the second subbank SB2 may not be allocated to a wordline of the first subbank SB1.

Figure 17:
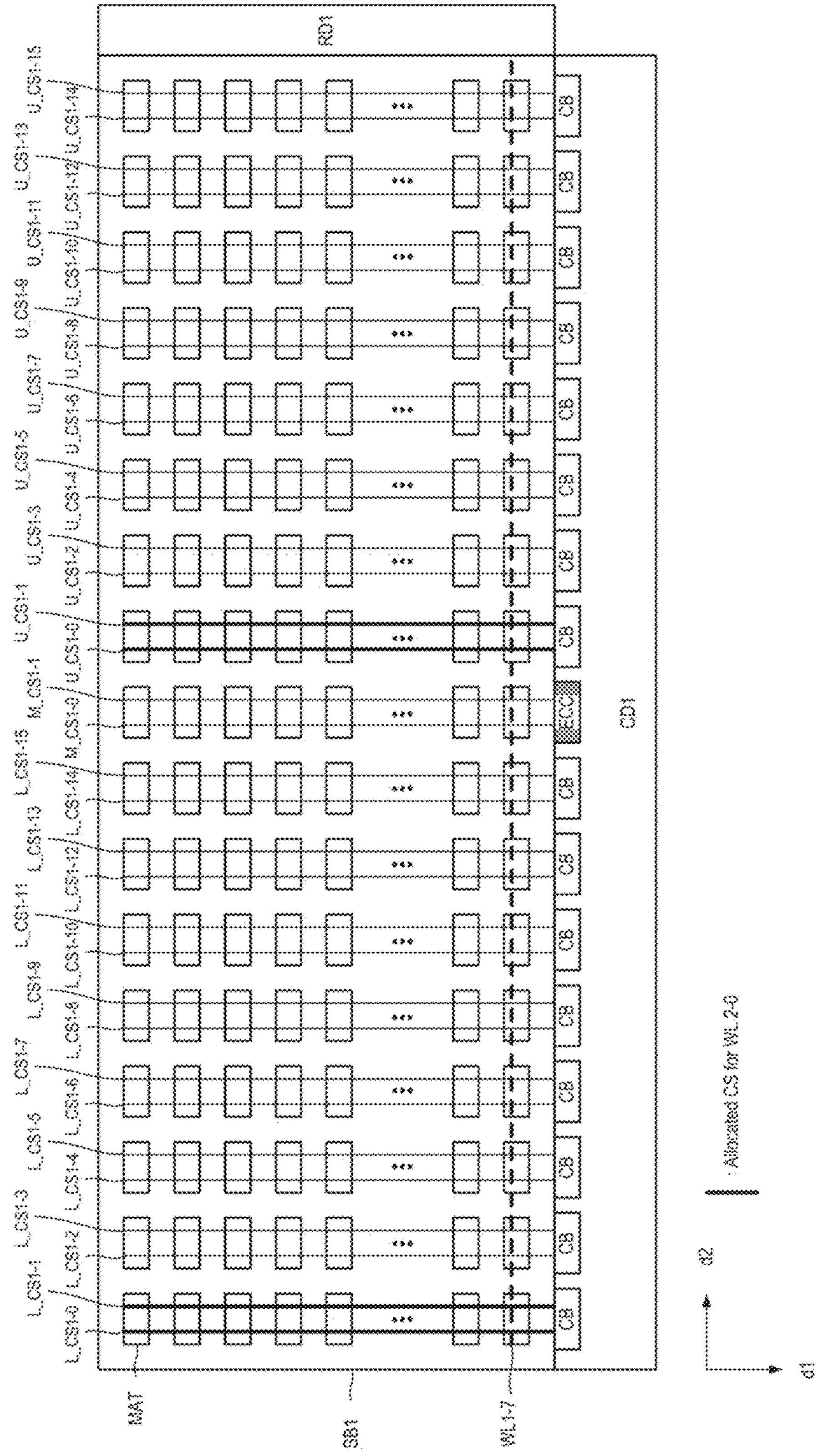
FIGS. 17 and 18 are diagrams illustrating an allocation relationship between a first wordline and a CSL when a second subbank is the normal-side subbank.
Figure 18:
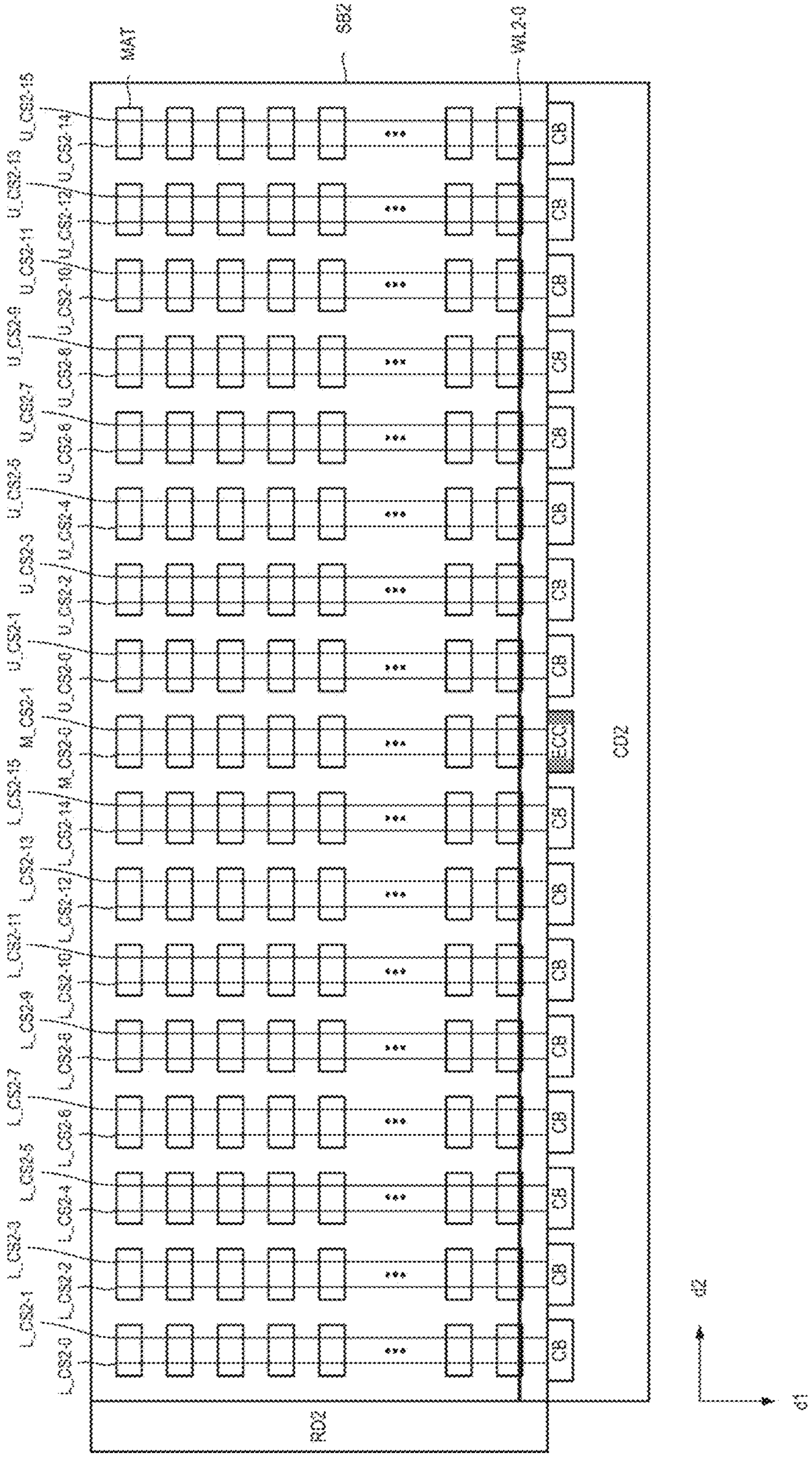

FIGS. 17 and 18 are diagrams illustrating an allocation relationship between a first wordline and a CSL when a second subbank SB2 is the normal-side subbank.

Referring to FIGS. 17 and 18, when a 1st second wordline WL2-0 is selected through the second row decoder RD2 connected to the second subbank SB2 to read or write normal data, an 8th first wordline WL1-7 may be selected through the first row decoder RD1 connected to the first subbank SB1 to read or write metadata corresponding to the normal data. For example, an allocation relationship of FIGS. 17 and 18 may have a cross structure with the allocation relationship of FIGS. 11 and 12.

The first column decoder CD1 may select all of the CSL subsets L_CS1-0 to U_CS1-15 for the second subbank SB2 that is a normal-side subbank, and the second column decoder CD2 may select a pair of first-side CSL subsets L_CS1-0 and L_C1-1 and a pair of second-side CSL subsets U_CS1-0 and U_CS1-1, allocated for metadata, for a first subbank SB1 that is a meta-side subbank. In this case, a column select signal for selecting a CSL subset may be CSLx[0:15] (where x is one of 0 to 63) generated from the second column decoder CD2, and may be CSLx[0:1] (where x is one of 0 to 63) generated from the first column decoder CD2.

Accordingly, from the second subbank SB2 that is a normal-side subbank, normal data may be output from a 1st second wordline WL2-0 and a plurality of first CSL subsets L_CS1-0 to U_CS1-15. In addition, from the first subbank SB1 that is a meta-side subbank, metadata corresponding to the normal data may be simultaneously output from an 8th second wordline WL2-7, a pair of first-side CSL subsets L_CS1-0 and L_CS1-1, and a pair of second-side subsets U_CS1-0 and U_CS1-1.

Figure 19:
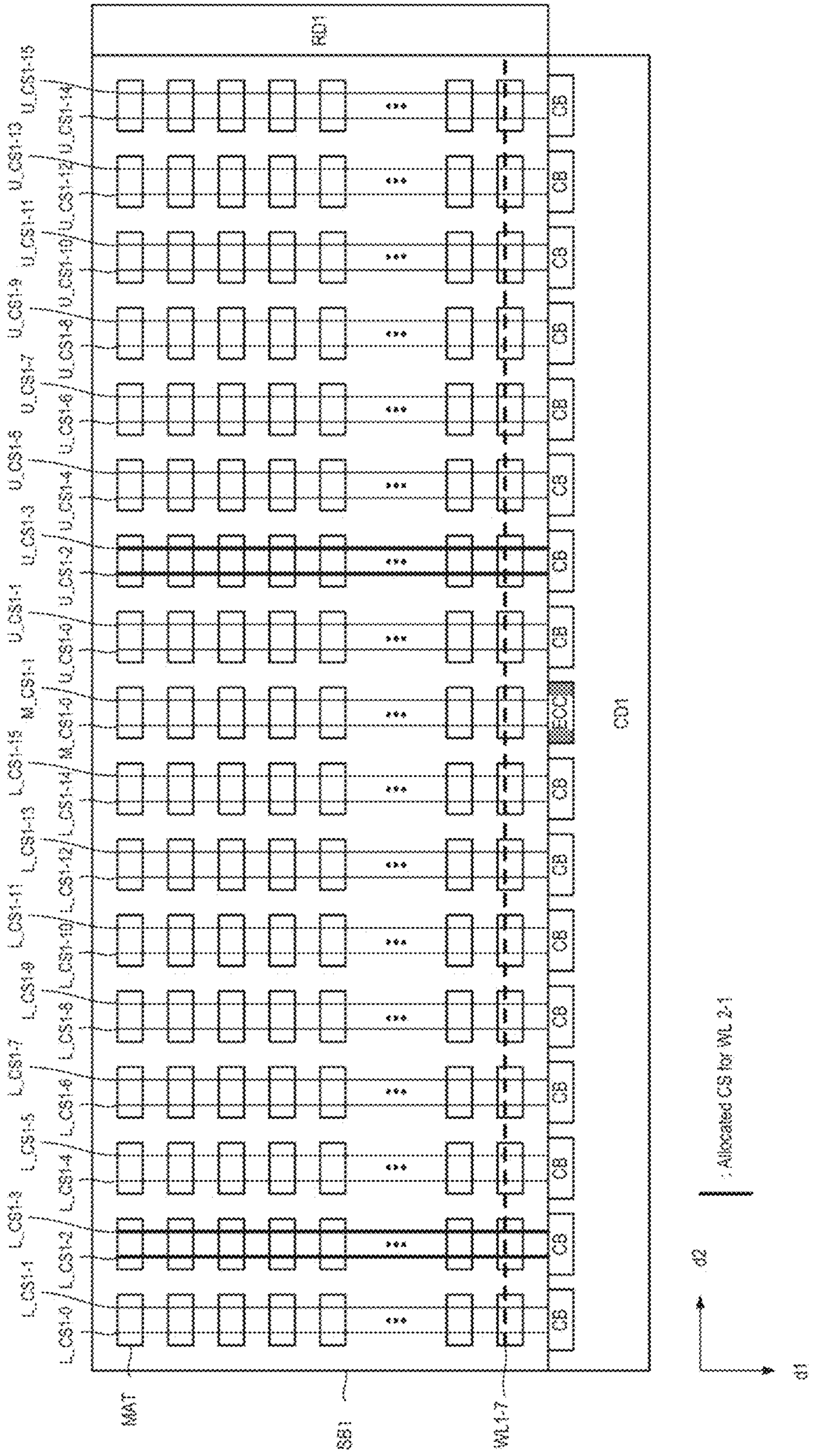
FIGS. 19 and 20 are diagram illustrating an allocation relationship between the second wordline and a CSL when a second subbank is a normal-side subbank.
Figure 20:
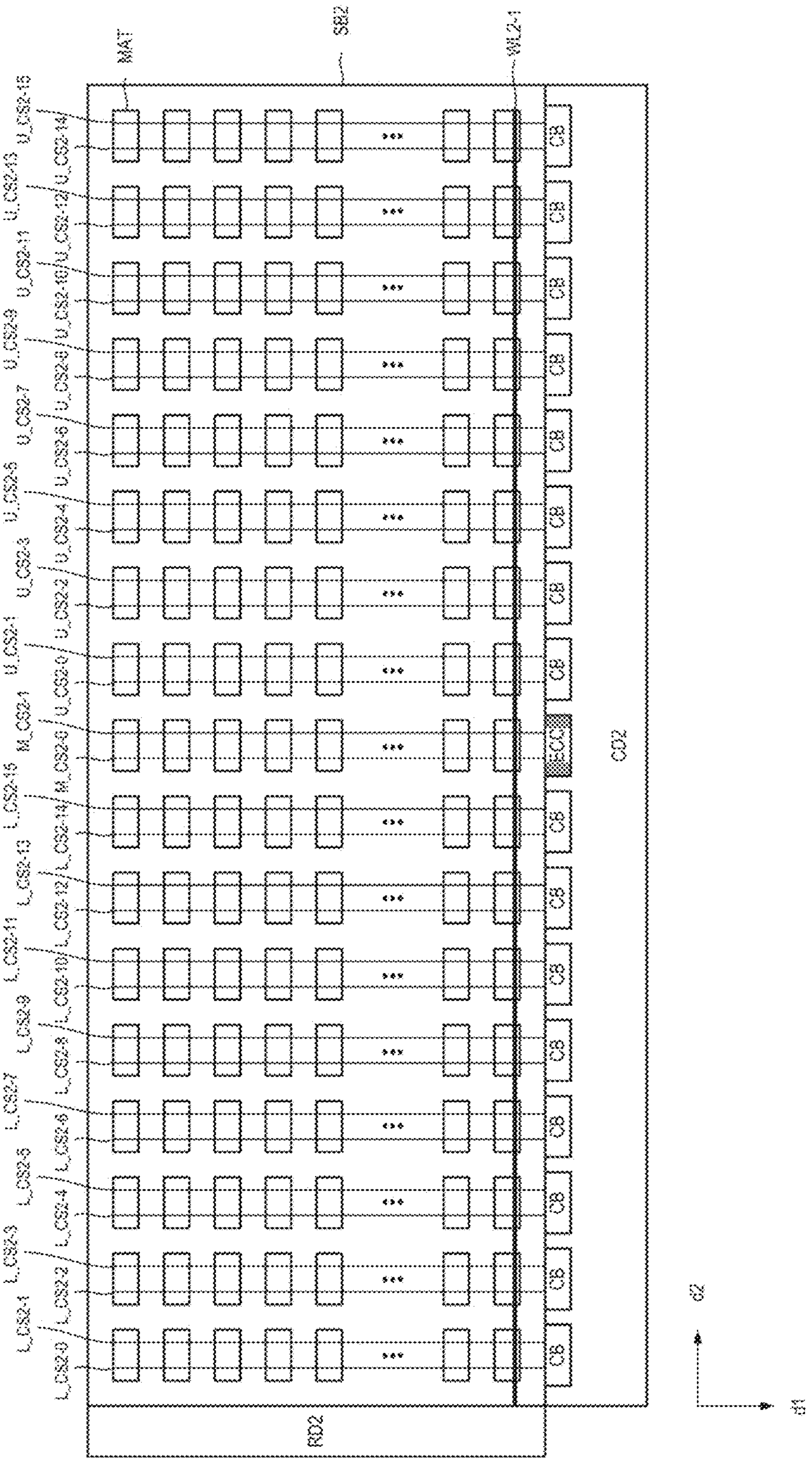

FIGS. 19 and 20 are diagrams illustrating an allocation relationship between the second wordline and a CSL when a second subbank SB2 is a normal-side subbank.

Referring to FIGS. 19 and 20, when a 2nd second wordline WL2-1 is selected through the second row decoder RD2 connected to the second subbank SB2 to read or write normal data, an 8th first wordline WL1-7 may be selected through the first row decoder RD1 connected to the first subbank SB1 to read or write metadata corresponding to the normal data. For example, an allocation relationship of FIGS. 19 and 20 may have a cross structure with the allocation relationship of FIGS. 13 and 14.

The first column decoder CD1 may select all of the CSL subsets L_CS1-0 to U_CS1-15 for the second subbank SB2 that is a normal-side subbank, and the second column decoder CD2 may select a pair of first-side CSL subsets L_CS1-2 and L_C1-3 and a pair of second-side CSL subsets U_CS1-2 and U_CS1-3, allocated for metadata, for a first subbank SB1 that is a meta-side subbank. In this case, a column select signal for selecting a CSL subset may be CSLx[0:15] (where x is one of 0 to 63) generated from the second column decoder CD2, and may be CSLx[2:3] (where x is one of 0 to 63) generated from the first column decoder CD2.

Every pair of CSL subsets of the first subbank SB1 may be sequentially allocated from a 3rd first wordline to the last wordline of the second subbank SB2.

Figure 21:
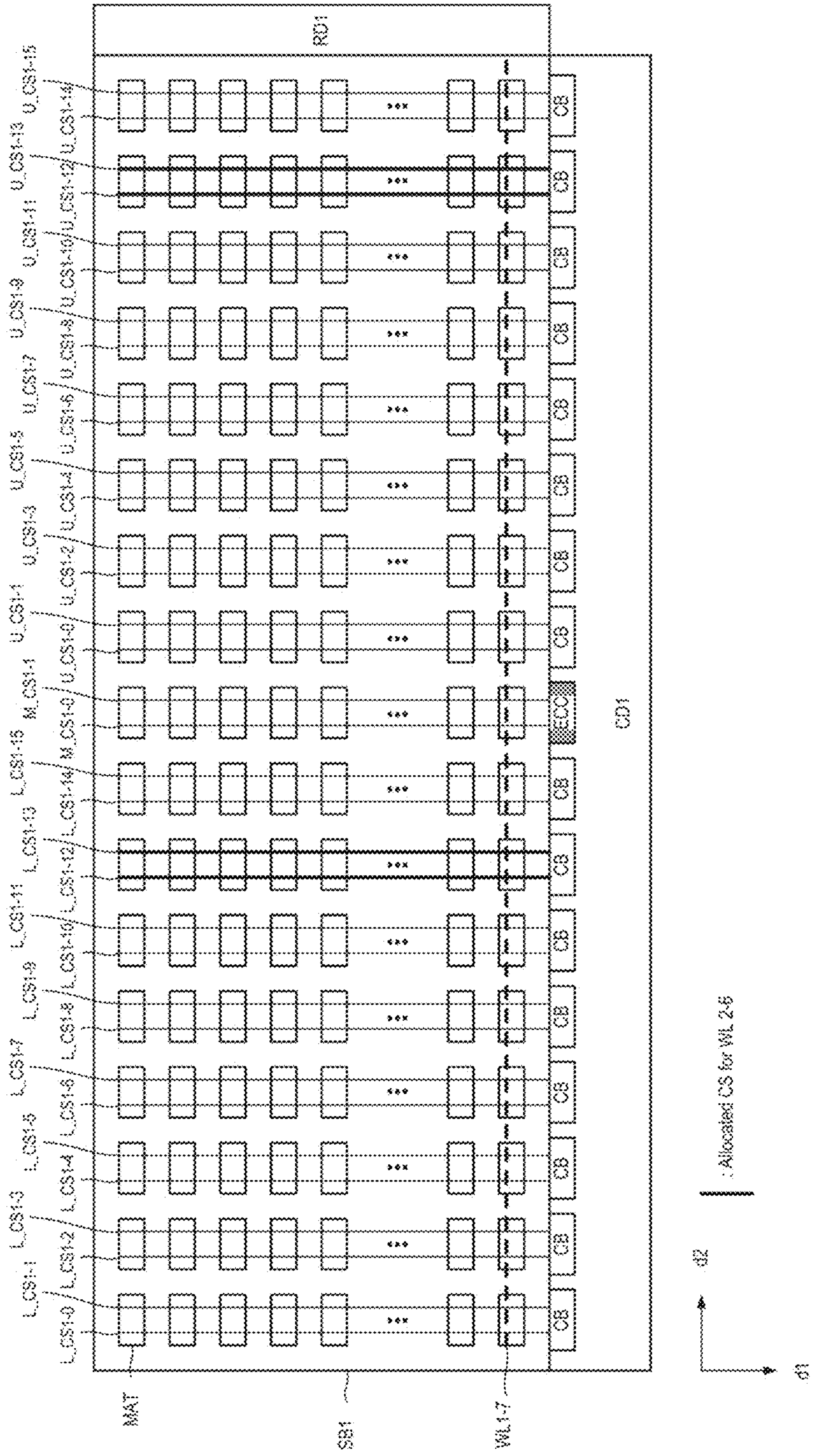
FIGS. 21 and 22 are diagrams illustrating an allocation relationship between a last wordline and a CSL when a second subbank is a normal-side subbank.
Figure 22:
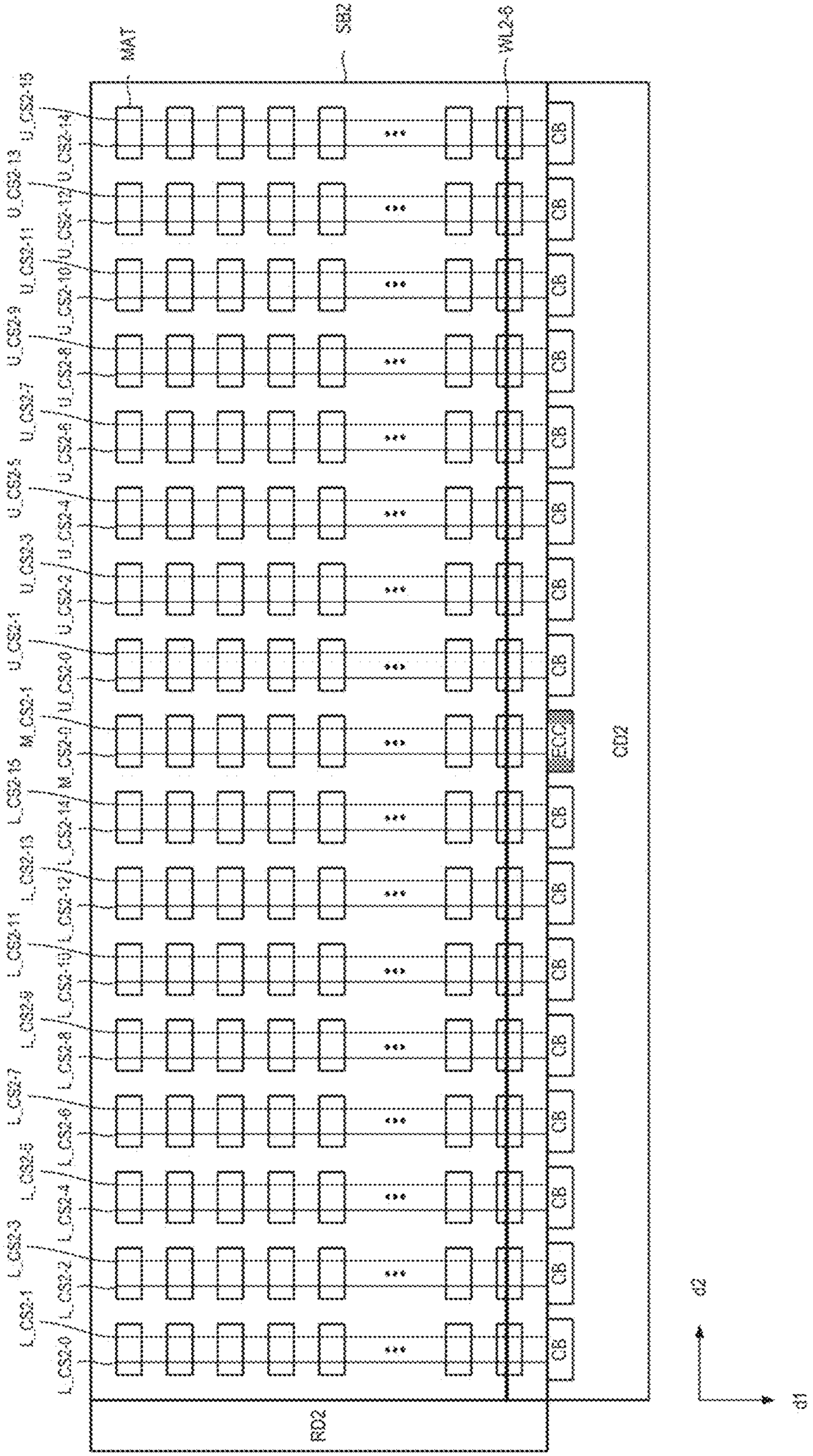

FIGS. 21 and 22 are diagrams illustrating an allocation relationship between a last wordline and a CSL when a second subbank SB2 is a normal-side subbank.

Referring to FIGS. 21 and 22, when a 7th second wordline WL2-6 is selected through the second row decoder RD2 connected to the second subbank SB2 to read or write normal data, an 8th first wordline WL1-7 may be selected through the first row decoder RD1 connected to the first subbank SB1 to read or write metadata corresponding to the normal data. For example, an allocation relationship of FIGS. 21 and 22 may have a cross structure with the allocation relationship of FIGS. 15 and 16.

The first column decoder CD1 may select all of the CSL subsets L_CS1-0 to U_CS1-15 for the second subbank SB2 that is a normal-side subbank, and the second column decoder CD2 may select a pair of first-side CSL subsets L_CS1-12 and L_C1-13 and a pair of second-side CSL subsets U_CS1-12 and U_CS1-13, allocated for metadata, for a first subbank SB1 that is a meta-side subbank. In this case, a column select signal for selecting a CSL subset may be CSLx[0:15] (where x is one of 0 to 63) generated from the second column decoder CD2, and may be CSLx[12:13] (where x is one of 0 to 63) generated from the first column decoder CD2.

A pair of CSL subsets L_CS1-14, L_CS1-15, U_CS1-14, and U_CS1-15) corresponding to CSLx[14:15] in the first subbank SB1 may not be allocated to a wordline of the second subbank SB2.

Figure 23:
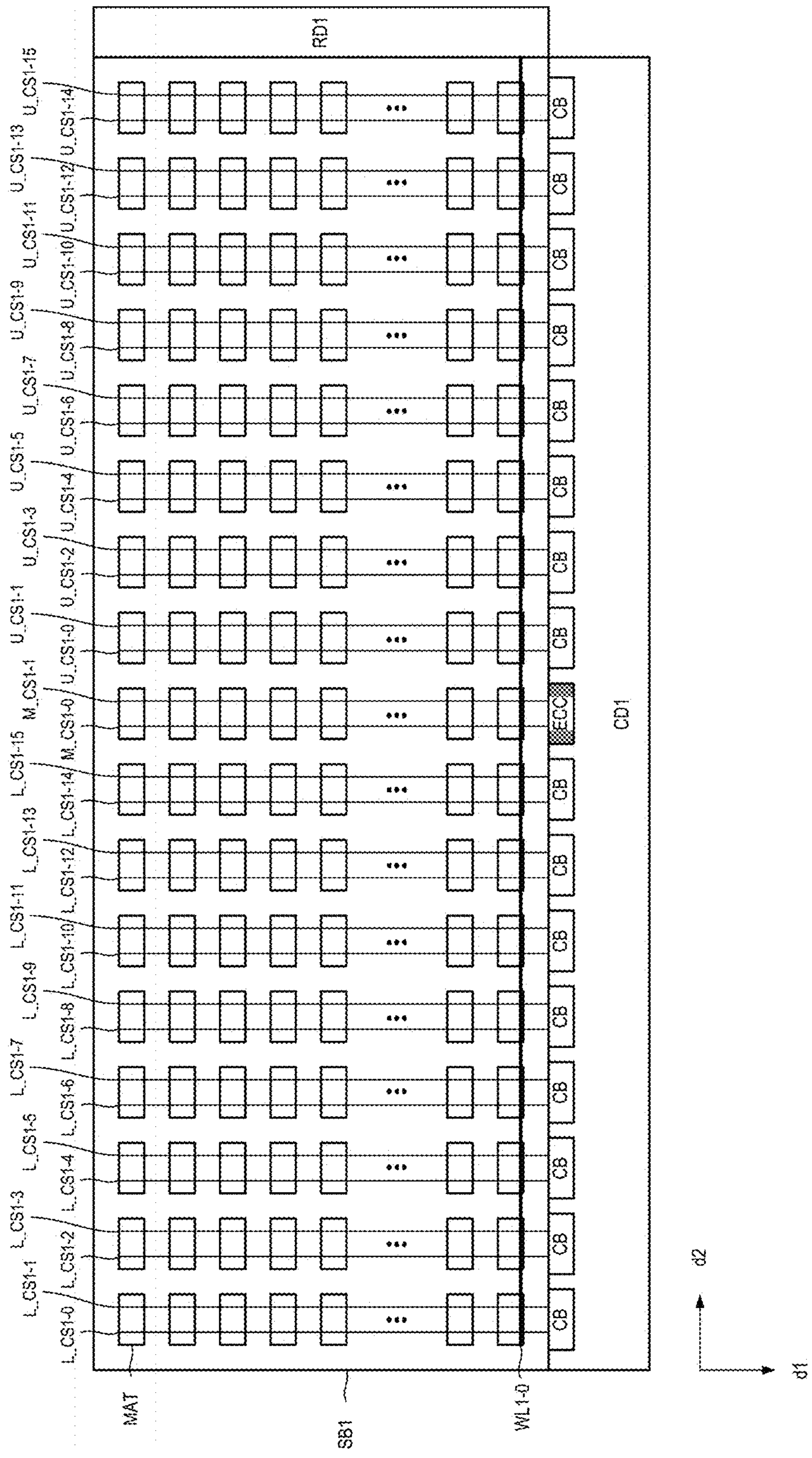
FIGS. 23 and 24 are diagrams illustrating an allocation relationship between a first wordline and a CSL when a first subbank is a normal-side subbank.
Figure 24:
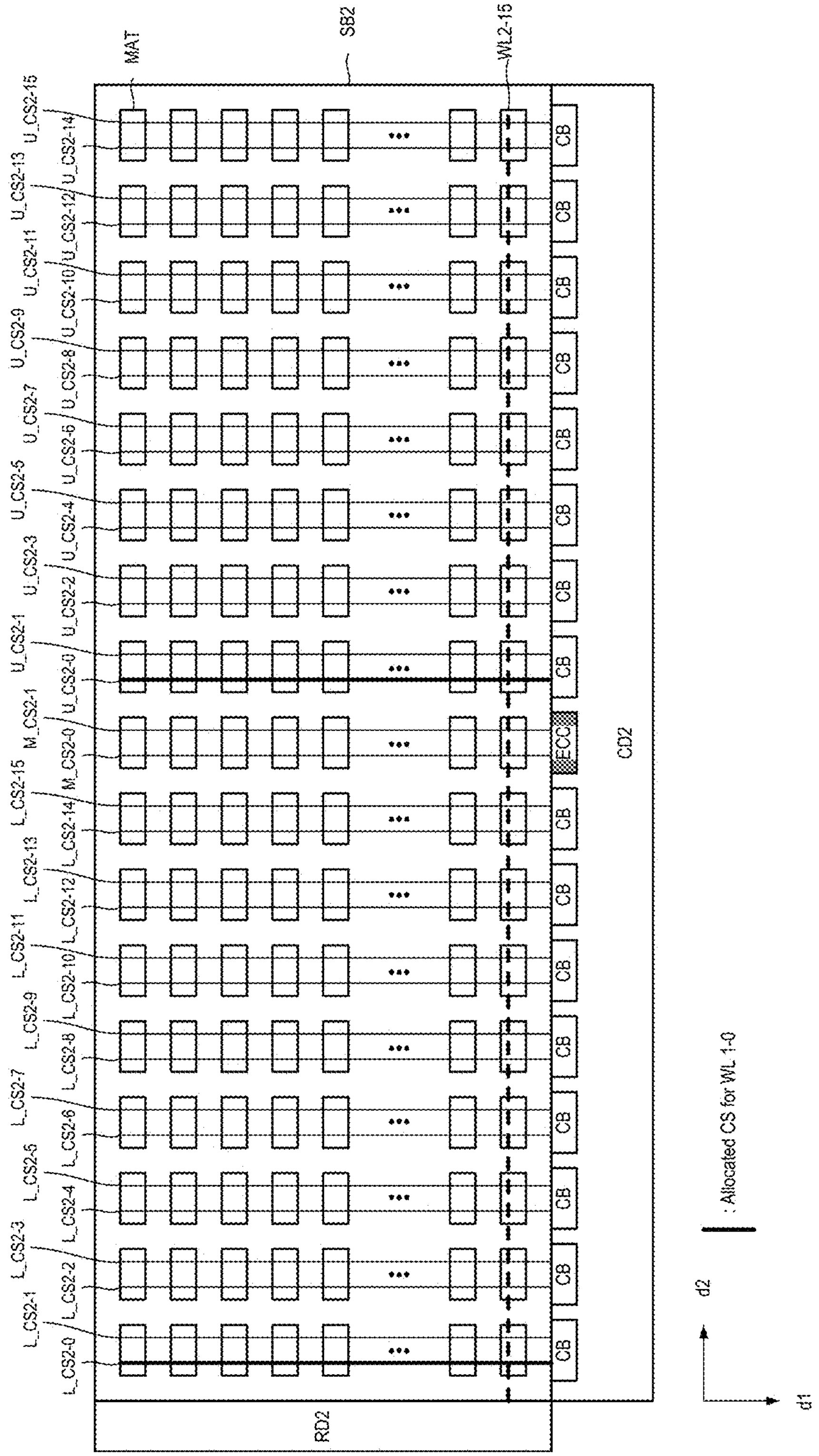

FIGS. 23 and 24 are diagrams illustrating an allocation relationship between a first wordline and a CSL when a first subbank SB1 is a normal-side subbank.

Referring to FIGS. 23 and 24, according to an example implementation, every r-th wordline of the first subbank SB1 and the second subbank SB2 may be allocated for metadata, for example, r may be 16. When a 1st first wordline WL1-0 is selected through the first row decoder RD1 connected to the first subbank SB1 to read or write normal data, a sixteenth second wordline WL2-15 may be selected through the second row decoder RD2 connected to the second subbank SB2 to read or write metadata corresponding to the normal data.

Among the second CSL subsets L_CS2-0 to U_CS2-15, a first-side CSL subset L_CS2-0 and a second-side CSL subset U_CS2-0 may be allocated to the first wordline WL1-0.

Then, the first column decoder CD1 may select all of the CSL subsets L_CS1-0 to U_CS1-15 for the first subbank SB1 that is a normal-side subbank, and the second column decoder CD2 may select a first-side CSL subset L_CS2-0 and a pair of second-side CSL subset U_CS2-0, allocated for metadata, for a second subbank SB2 that is a meta-side subbank. In this case, a column select signal for selecting a CSL subset may be CSLx[0:15] (where x is one of 0 to 63) generated from the first column decoder CD1, and may be CSLx[0] (where x is one of 0 to 63) generated from the second column decoder CD2.

Accordingly, from the first subbank SB1 that is a normal-side subbank, normal data may be output from a 1st first wordline WL1-0 and a plurality of first CSL subsets L_CS1-0 to U_CS1-15. In addition, from the second subbank SB2 that is a meta-side subbank, metadata corresponding to the normal data may be simultaneously output from a 16th second wordline WL2-15 and a single second-side subset U_CS2-0.

Figure 25:
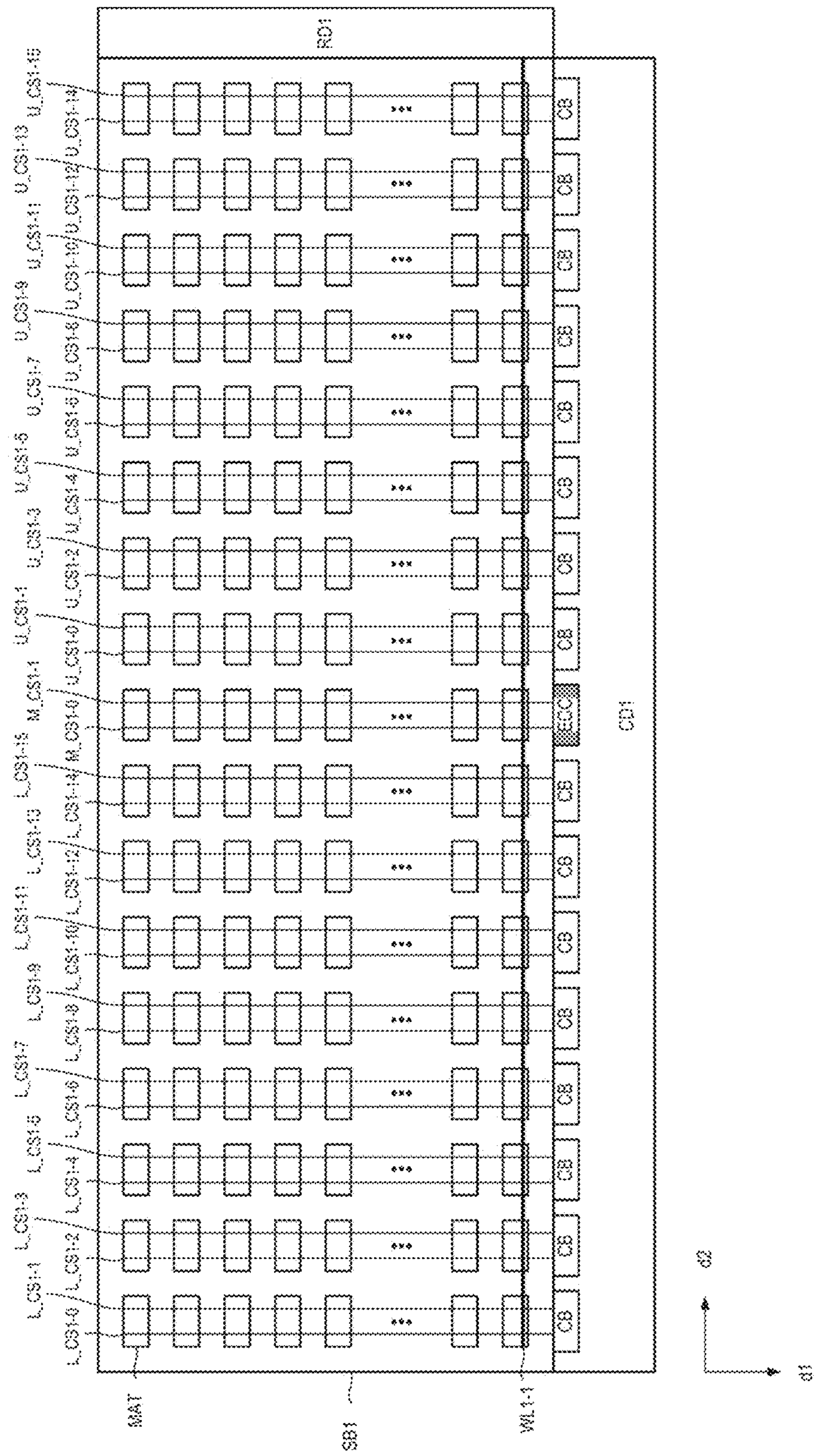
FIGS. 25 and 26 are diagrams illustrating an allocation relationship between a second wordline and a CSL when a first subbank is a normal-side subbank.
Figure 26:
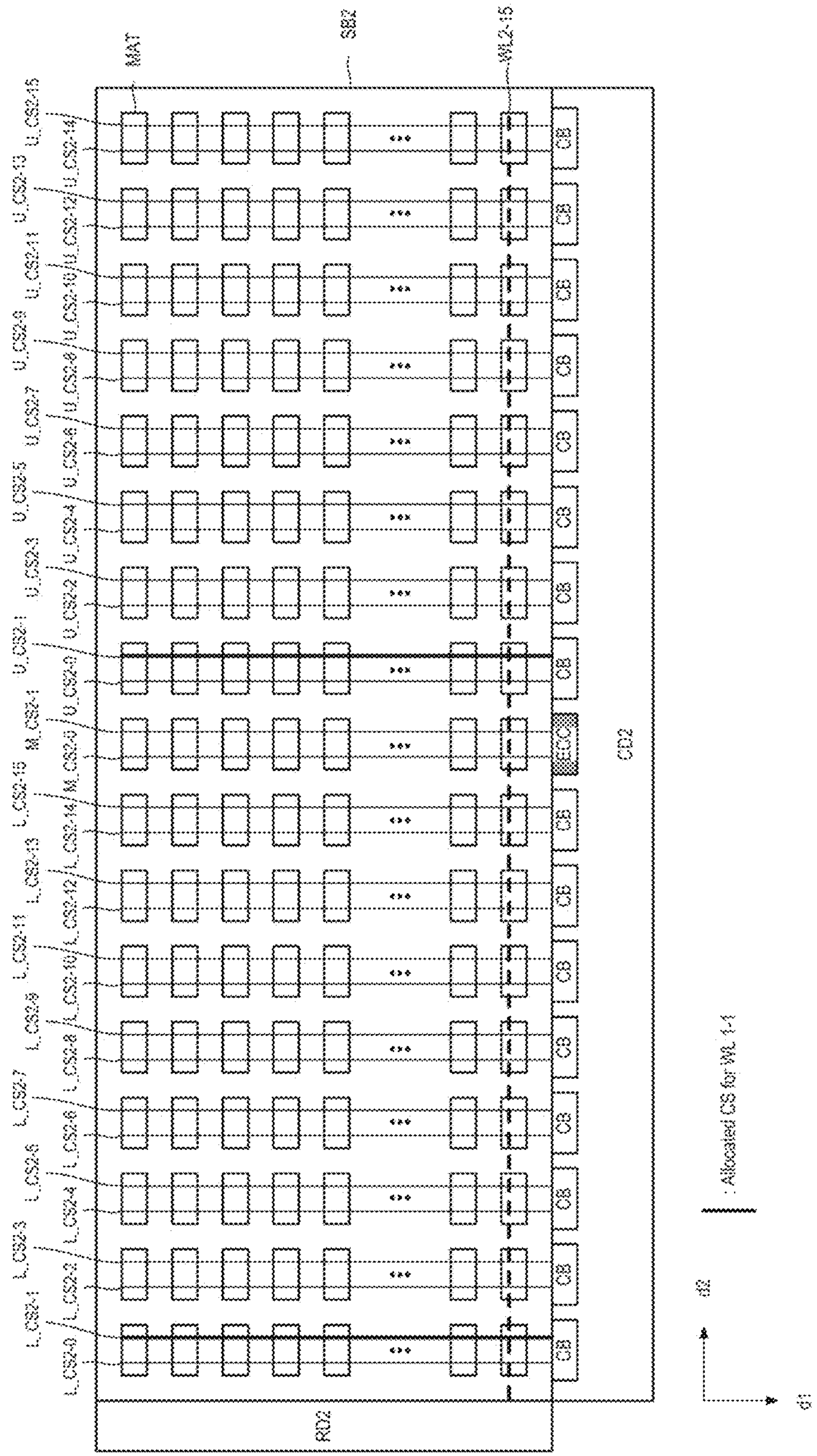

FIGS. 25 and 26 are diagrams illustrating an allocation relationship between a second wordline and a CSL when a first subbank SB1 is a normal-side subbank.

Referring to FIGS. 25 and 26, when a 2nd first wordline WL1-1 is selected through the first row decoder RD1 connected to the first subbank SB1 to read or write normal data, a 16th second wordline WL2-15 may also be selected through the second row decoder RD2 connected to the second subbank SB2 to read or write metadata corresponding to the normal data.

Among the second CSL subsets L_CS2-0 to U_CS2-15, a first-side CSL subset L_CS2-1 and a second-side CSL subset U_CS2-1 may be allocated to the first wordline WL1-1.

Then, the first column decoder CD1 may select all of the CSL subsets L_CS1-0 to U_CS1-15 for the first subbank SB1 that is a normal-side subbank, and the second column decoder CD2 may select a first-side CSL subset L_CS2-1 and a second-side CSL subset U_CS2-1, allocated for metadata, for a second subbank SB2 that is a meta-side subbank. In this case, a column select signal for selecting a CSL subset may be CSLx[0:15] (where x is one of 0 to 63) generated from the first column decoder CD1, and may be CSLx[1] (where x is one of 0 to 63) generated from the second column decoder CD2.

Accordingly, from the first subbank SB1 that is a normal-side subbank, normal data may be output from a 2nd first wordline WL1-1 and a plurality of first CSL subsets L_CS1-0 to U_CS1-15. In addition, from the second subbank SB2 that is a meta-side subbank, metadata corresponding to the normal data may be simultaneously output from a 16th second wordline WL2-15, a first-side CSL subset L_CS2-1, and a second-side CSL subset U_CS2-1.

Every CSL subset of the second subbank SB2 may be sequentially allocated from a 3rd first wordline to a last wordline of the first subbank SB1.

Figure 27:
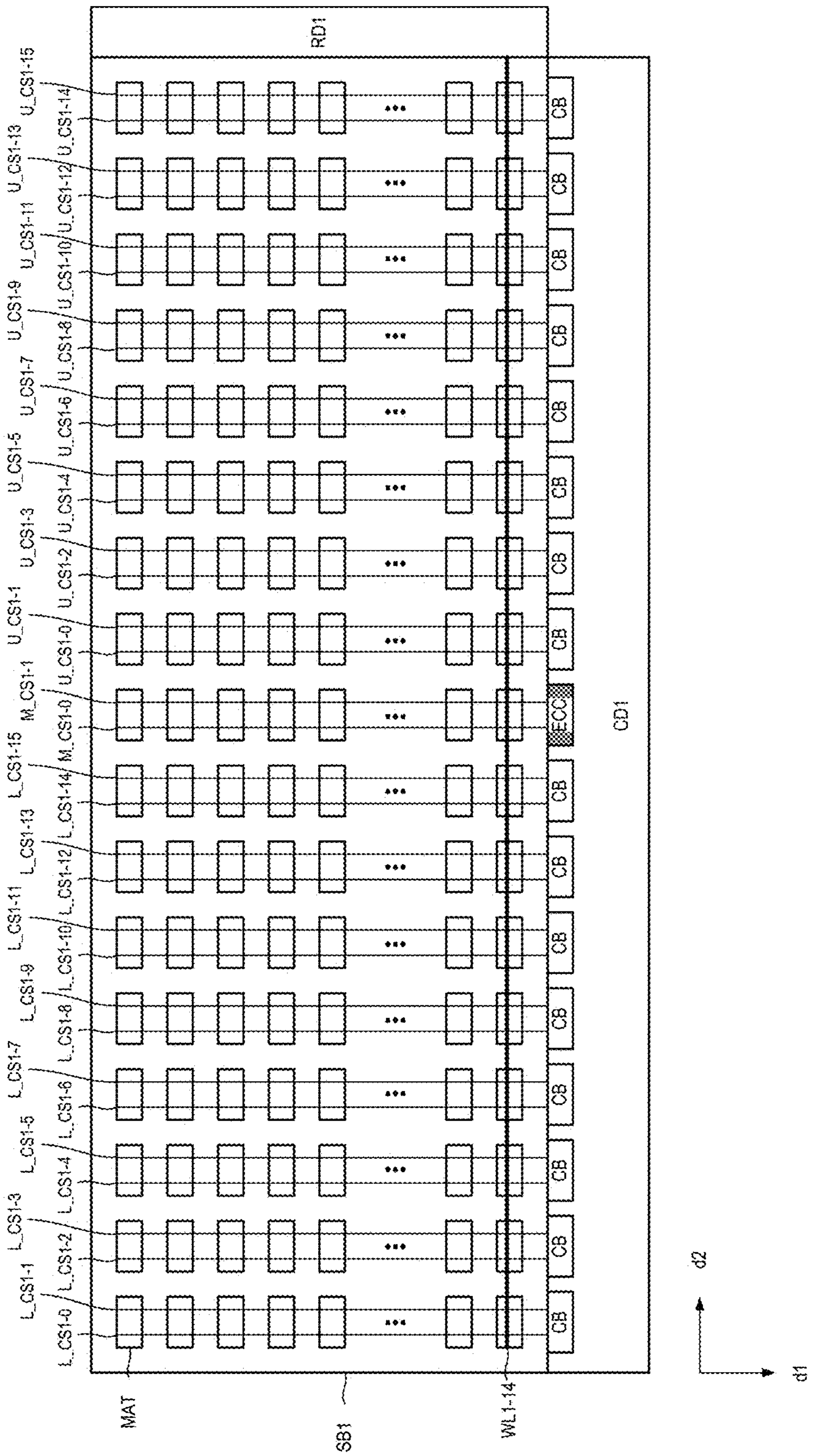
FIGS. 27 and 28 are diagrams illustrating an allocation relationship between a last wordline and a CSL when a first subbank is a normal-side subbank.
Figure 28:
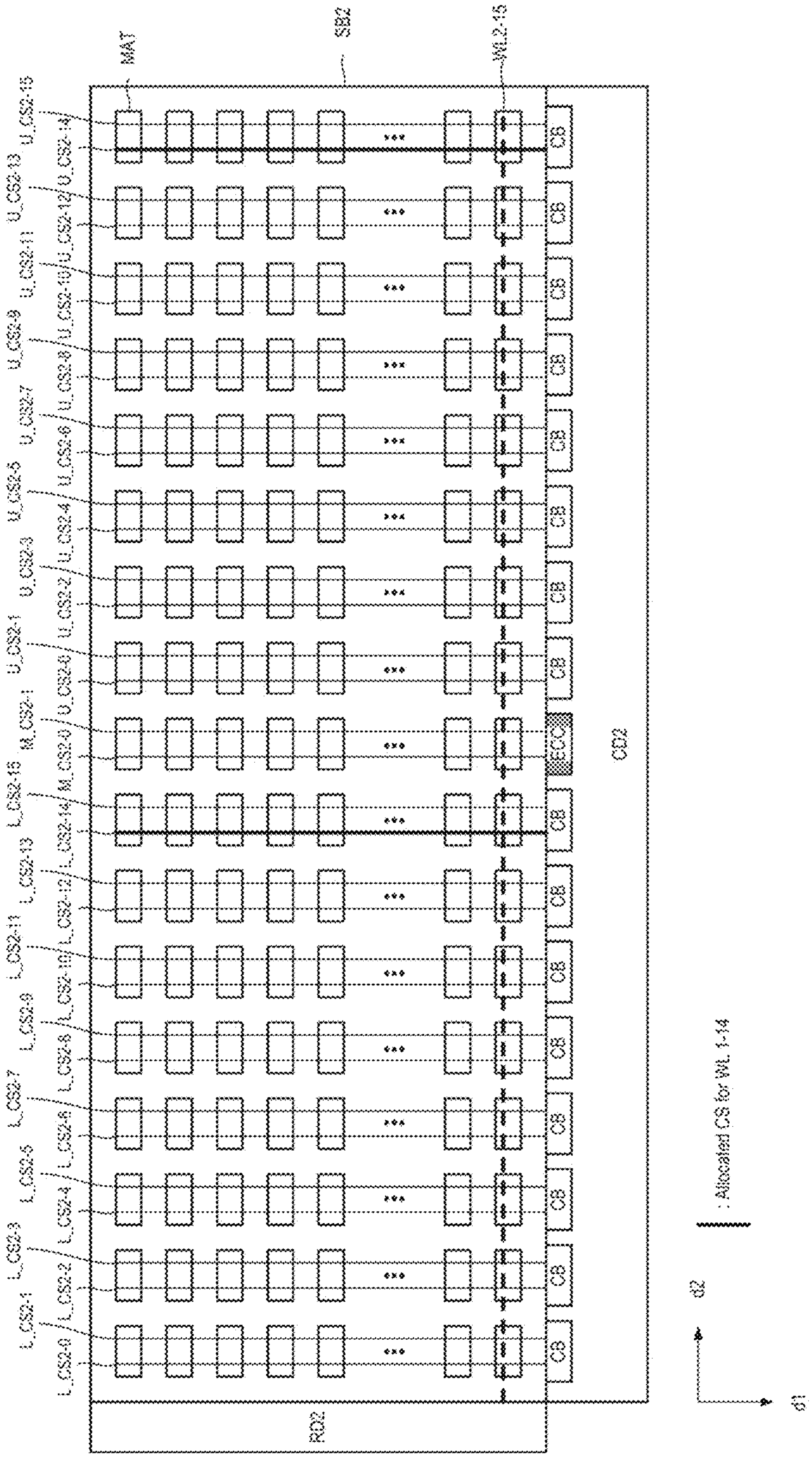

FIGS. 27 and 28 are diagrams illustrating an allocation relationship between a last wordline and a CSL when a first subbank SB1 is a normal-side subbank.

Referring to FIGS. 27 and 28, when a 15th first wordline WL1-14 is selected through the first row decoder RD1 connected to the first subbank SB1 to read or write normal data, a 16th second wordline WL2-15 may also be selected through the second row decoder RD2 connected to the second subbank SB2 to read or write metadata corresponding to the normal data.

The first column decoder CD1 may select all of the CSL subsets L_CS1-0 to U_CS1-15 for the first subbank SB1 that is a normal-side subbank, and the second column decoder CD2 may select a first-side CSL subset L_CS2-14 and a second-side CSL subset U_CS2-14, allocated for metadata, for the second subbank SB2 that is a meta-side subbank. In this case, a column select signal for selecting a CSL subset may be CSLx[0:15] (where x is one of 0 to 63) generated from the first column decoder CD1, and may be CSLx[14] (where x is one of 0 to 63) generated from the second column decoder CD2.

Accordingly, from the first subbank SB1 that is a normal-side subbank, normal data may be output from a 15th first wordline WL1-14 and a plurality of first CSL subsets L_CS1-0 to U_CS1-15. In addition, from the second subbank SB2 that is a meta-side subbank, metadata corresponding to the normal data may be simultaneously output from a 16th second wordline WL2-15, a first-side CSL subset L_CS2-14, and a second-side CSL subset U_CS2-14.

In this case, the CSL subsets L_CS2-15 and U_CS2-15 corresponding to CSLx[15] in the second subbank SB2 may not be allocated to a wordline of the first subbank SB1.

Figure 29:
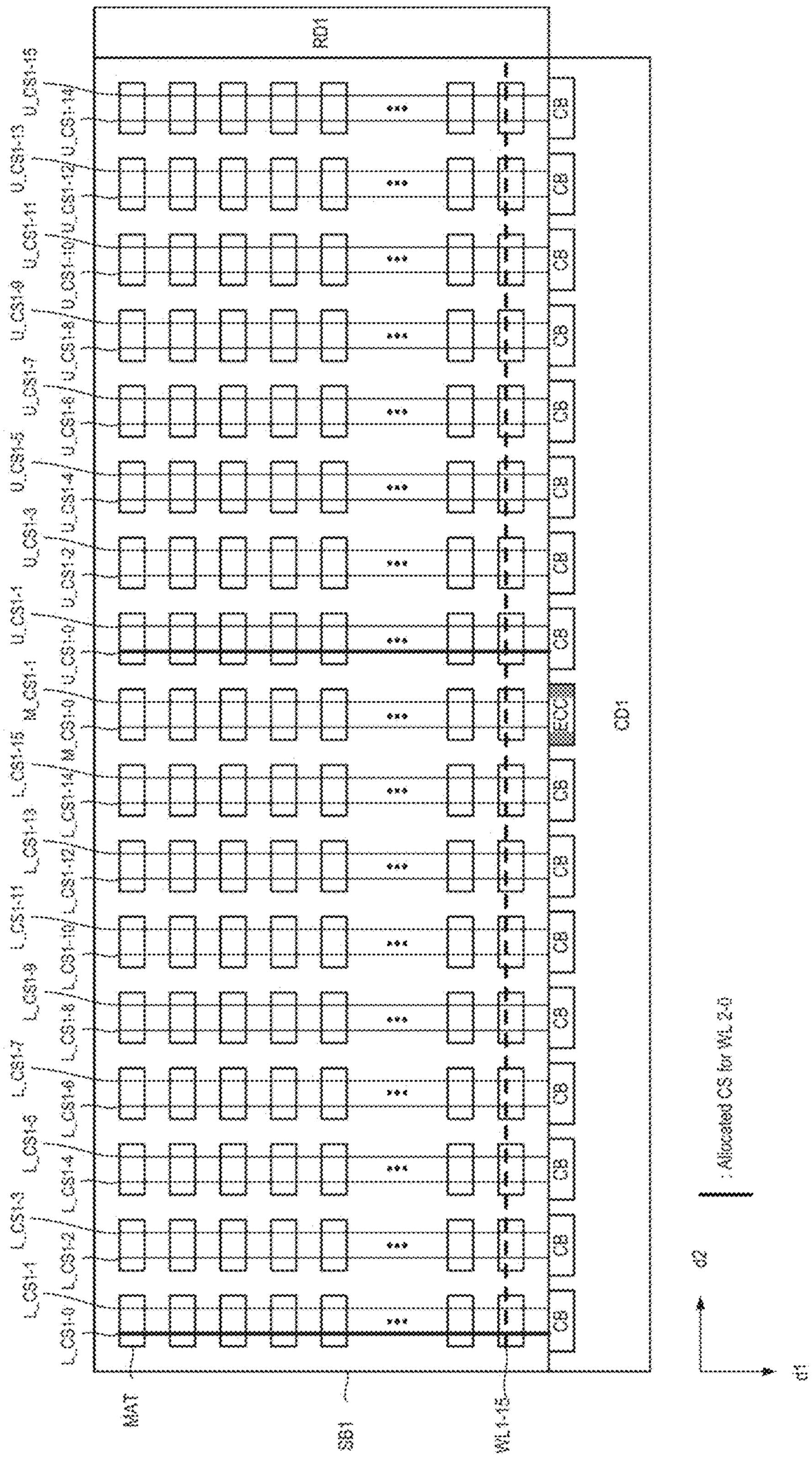
FIGS. 29 and 30 are diagrams illustrating an allocation relationship between a first wordline and a CSL when a second subbank is a normal-side subbank.
Figure 30:
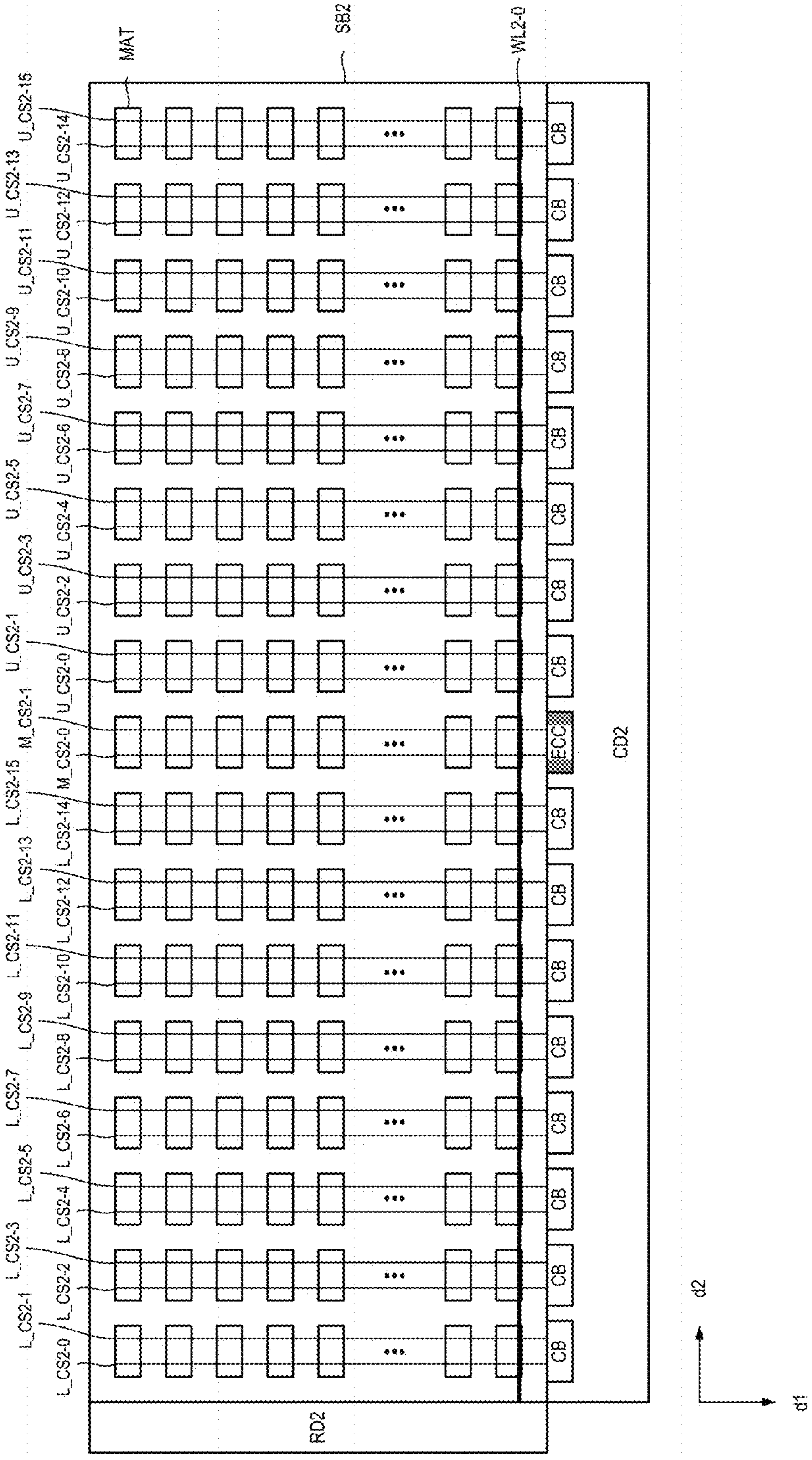

FIGS. 29 and 30 are diagrams illustrating an allocation relationship between a first wordline and a CSL when a second subbank SB2 is a normal-side subbank.

Referring to FIGS. 29 and 30, when a 1st second wordline WL2-0 is selected through the second row decoder RD2 connected to the second subbank SB2 to read or write normal data, a 16th first wordline WL1-15 may be selected through the first row decoder RD1 connected to the first subbank SB1 to read or write metadata corresponding to the normal data. For example, an allocation relationship of FIGS. 29 and 30 may have a cross structure with the allocation relationship of FIGS. 23 and 24.

The first column decoder CD1 may select all of the CSL subsets L_CS1-0 to U_CS1-15 for the second subbank SB2 that is a normal-side subbank, and the second column decoder CD2 may select a first-side CSL subset L_CS1-0 and a second-side CSL subset U_CS1-0, allocated for metadata, for the first subbank SB1 that is a meta-side subbank. In this case, a column select signal for selecting a CSL subset may be CSLx[0:15] (where x is one of 0 to 63) generated from the second column decoder CD2, and may be CSLx[0] (where x is one of 0 to 63) generated from the first column decoder CD1.

Accordingly, from the second subbank SB2 that is a normal-side subbank, normal data may be output from a 1st second wordline WL2-0 and a plurality of first CSL subsets L_CS1-0 to U_CS1-15. In addition, from the first subbank SB2 that is a meta-side subbank, metadata corresponding to the normal data may be simultaneously output from an 8th second wordline WL2-7, a first-side CSL subset L_CS1-0, and a second-side CSL subset U_CS1-0.

Figure 31:
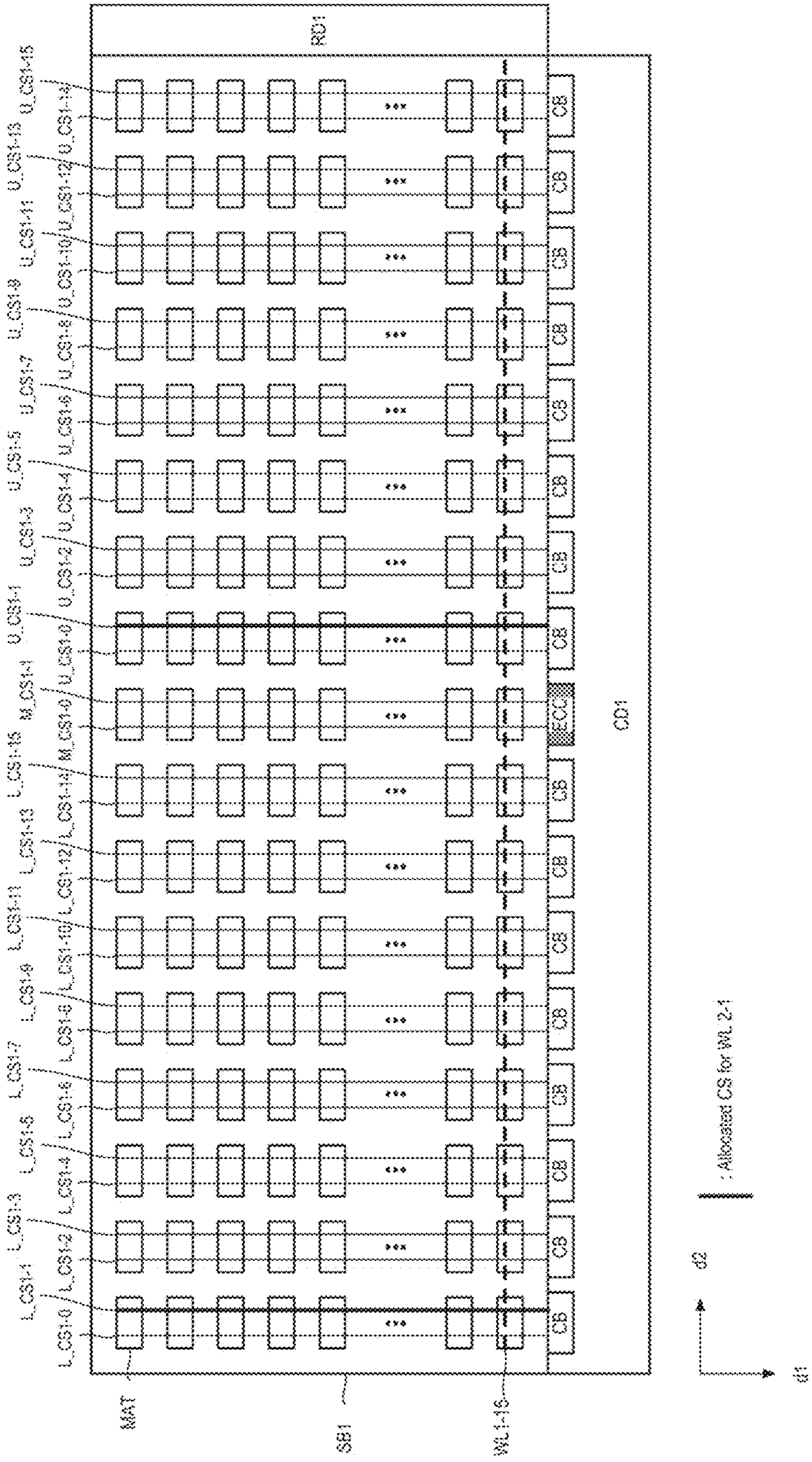
FIGS. 31 and 32 are diagrams illustrating an allocation relationship between a second wordline and a CSL when a second subbank is a normal-side subbank.
Figure 32:
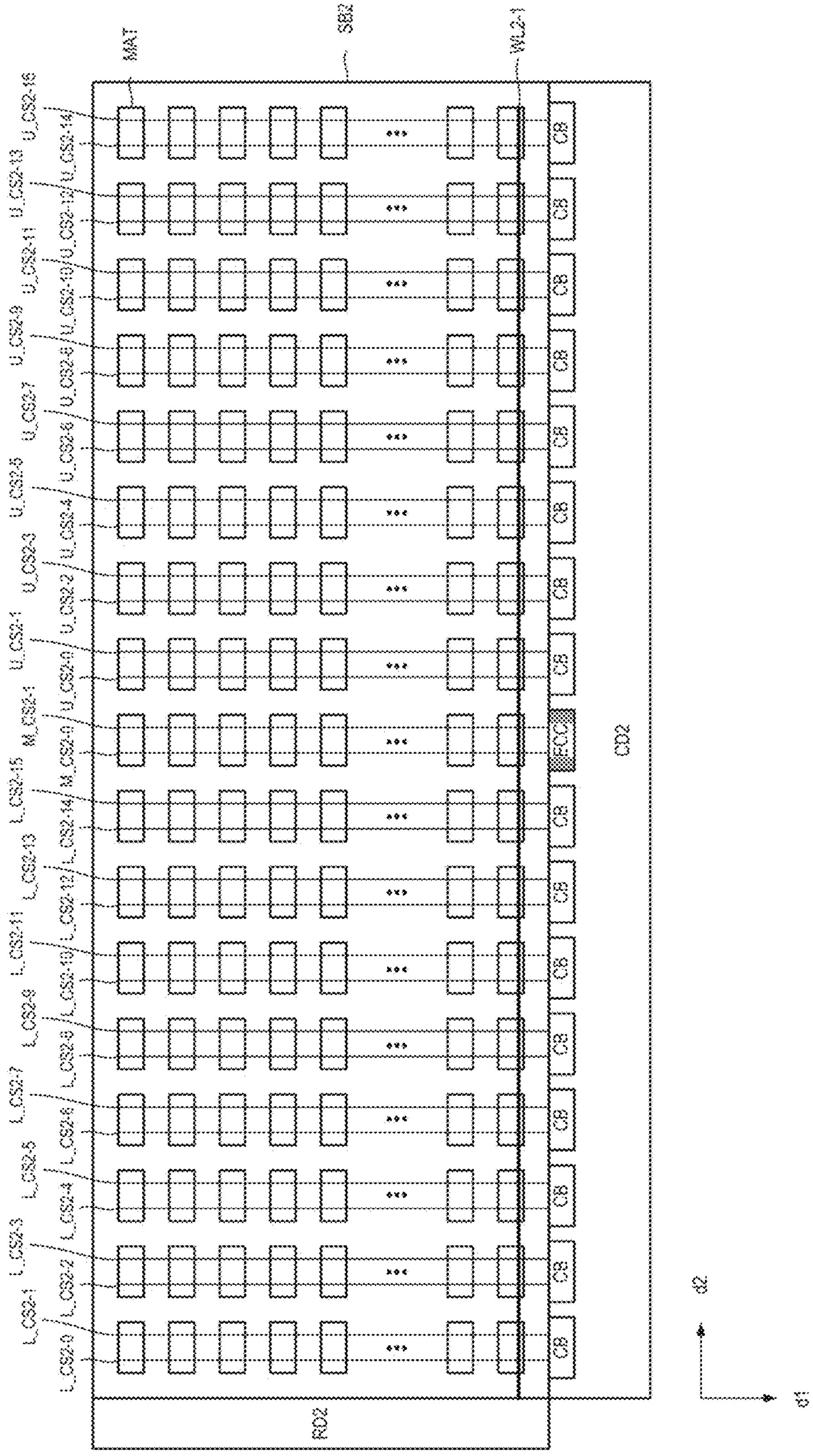

FIGS. 31 and 32 are diagrams illustrating an allocation relationship between a second wordline and a CSL when a second subbank SB2 is a normal-side subbank.

Referring to FIGS. 31 and 32, when a 2nd second wordline WL2-1 is selected through the second row decoder RD2 connected to the second subbank SB2 to read or write normal data, a 16th first wordline WL1-15 may be selected through the first row decoder RD1 connected to the first subbank SB1 to read or write metadata corresponding to the normal data. For example, an allocation relationship of FIGS. 31 and 32 may have a cross structure with the allocation relationship of FIGS. 25 and 26.

The first column decoder CD1 may select all of the CSL subsets L_CS1-0 to U_CS1-15 for the second subbank SB2 that is a normal-side subbank, and the second column decoder CD2 may select a first-side CSL subset L_CS1-1 and a second-side CSL subset U_CS1-1, allocated for metadata, for the first subbank SB1 that is a meta-side subbank. In this case, a column select signal for selecting a CSL subset may be CSLx[0:15] (where x is one of 0 to 63) generated from the second column decoder CD2, and may be CSLx[1] (where x is one of 0 to 63) generated from the first column decoder CD1.

Every CSL subset of the first subbank SB1 may be sequentially allocated from a 3rd first wordline to a last wordline of the second subbank SB2.

Figure 33:
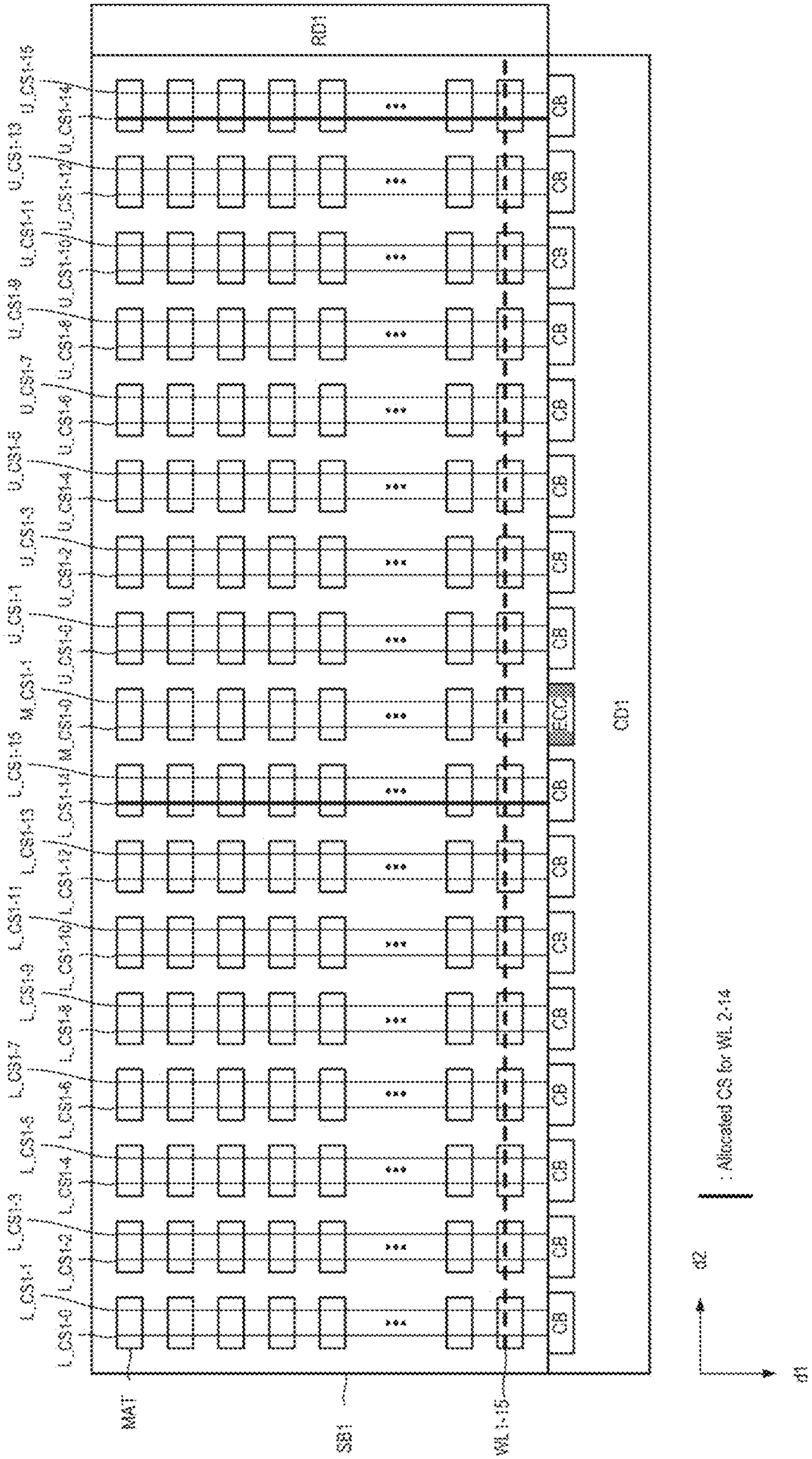
FIGS. 33 and 34 are diagrams illustrating an allocation relationship between a last wordline and a CSL when a second subbank is a normal-side subbank.
Figure 34:
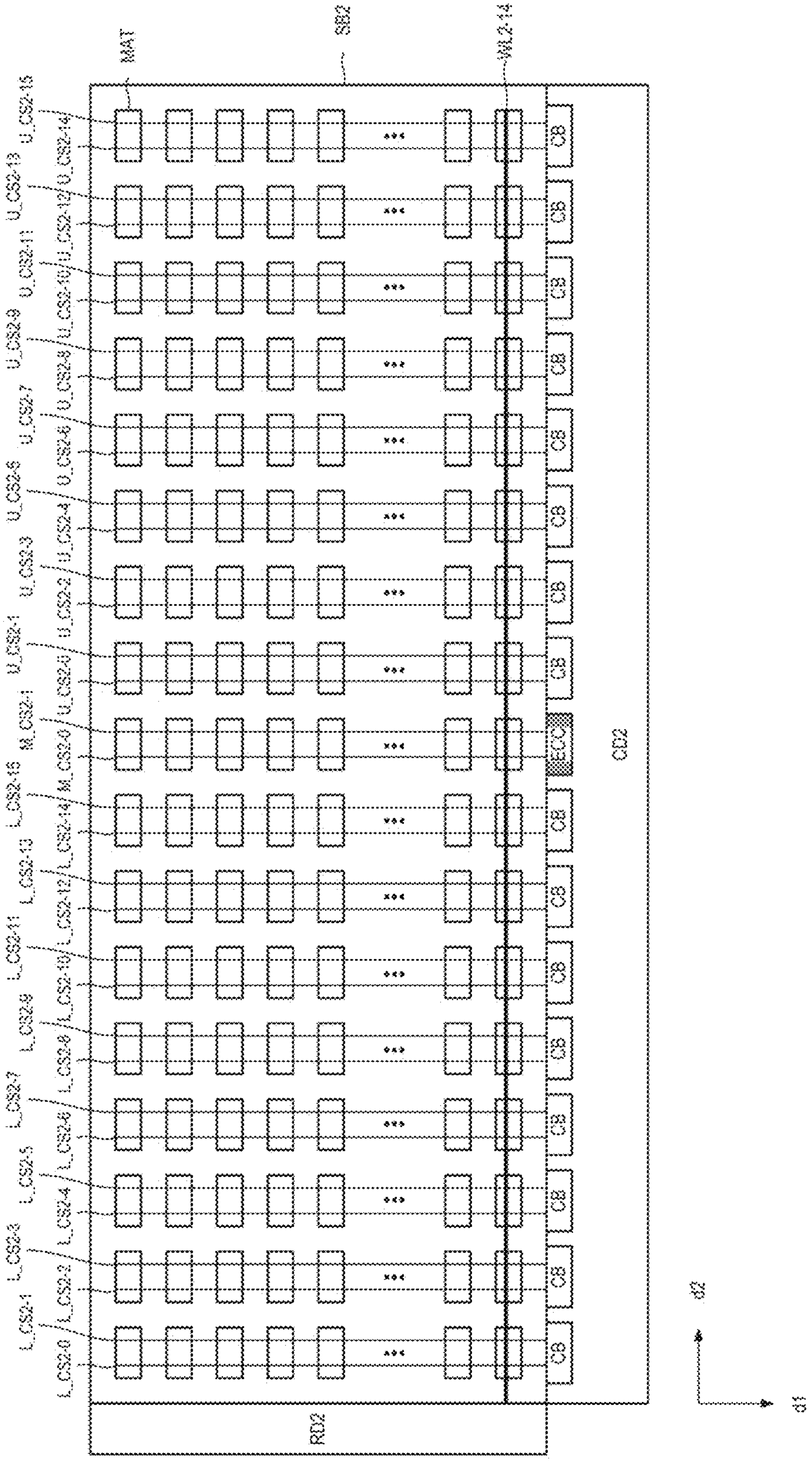

FIGS. 33 and 34 are diagrams illustrating an allocation relationship between a last wordline and a CSL when a second subbank SB2 is a normal-side subbank.

Referring to FIGS. 33 and 34, when a 15th second wordline WL2-14 is selected through the second row decoder RD2 connected to the second subbank SB2 to read or write normal data, a 16th first wordline WL1-15 may be selected through the first row decoder RD1 connected to the first subbank SB1 to read or write metadata corresponding to the normal data. For example, an allocation relationship of FIGS. 33 and 34 may have a cross structure with the allocation relationship of FIGS. 27 and 28.

The first column decoder CD1 may select all of the CSL subsets L_CS1-0 to U_CS1-15 for the second subbank SB2 that is a normal-side subbank, and the second column decoder CD2 may select a first-side CSL subset L_CS1-14 and a second-side CSL subset U_CS1-14, allocated for metadata, for the first subbank SB1 that is a meta-side subbank. In this case, a column select signal for selecting a CSL subset may be CSLx[0:15] (where x is one of 0 to 63) generated from the second column decoder CD2, and may be CSLx[14] (where x is one of 0 to 63) generated from the first column decoder CD1.

A pair of CSL subsets L_CS1-14, L_CS1-15, U_CS1-14, and U_CS1-15 corresponding to CSLx[15] in the first subbank SB1 may not be allocated to a wordline of the second subbank SB2.

According to the above-described implementations, at least a portion of the plurality of first CSL subsets L_CS1-0 to U_CS1-15 may be allocated to one of the remaining second wordlines, other than every r-th second wordline, among a plurality of second wordlines, and at least a portion of a plurality of second CSL subsets L_CS2-0 to U_CS2-15 may be allocated to one of the remaining first wordlines, other than every r-th first wordline, among a plurality of first wordlines.

According to an example implementation, when r is 8, at least a portion of the plurality of first CSL subsets L_CS1-0 to U_CS1-15 may be a pair of first CSL subsets L_CS1-0 to U_CS1-15 and at least a portion of the plurality of first CSL subsets L_CS1-0 to U_CS1-15 may be a pair of second CSL subsets L_CS2-0 to U_CS2-15.

Alternatively, according to an example implementation, when r is 16, at least a portion of the plurality of first CSL subsets L_CS1-0 to U_CS1-15 may be a single first CSL subset L_CS1-0 to U_CS1-15 and at least a portion of the plurality of first CSL subsets L_CS1-0 to U_CS1-15 may be a single second CSL subset L_CS2-0 to U_CS2-15.

The first row decoder RD1 connected to the first subbank SB1 may be configured to select one of the plurality of first wordlines, and the first column decoder CD1 may be configured to select a first CSL subset L_CS1-0 to U_CS1-15 from among the plurality of CSLs. In addition, the second row decoder RD2 connected to the second subbank SB2 may be configured to select one of the plurality of second wordlines, and the second column decoder CD2 may be configured to select the second row decoder RD2 and a second CSL subset L_CS2-0 to U_CS2-15 from among the plurality of CSLs. In an example implementation, the second row decoder RD2 may select a single second wordline allocated to a single first wordline of every r-th second wordline among the plurality of second wordlines, based on the first row decoder RD1 selecting one of the remaining first wordlines, other than every r-th first wordline, from among the plurality of first wordlines.

Alternatively, in an example implementation, the first row decoder RD1 may select a single first wordline allocated to a single second wordline of every r-th first wordline from among the plurality of first wordlines, based on the second row decoder RD2 selecting one of the remaining second wordlines, other than every r-th second wordline, from among the plurality of second wordlines According to the above-described implementations, when one of the subbanks included in a single bank operates as a normal-side subbank, the remaining subbanks may operate as meta-side subbanks. For example, a CSL subset of the meta-side subbank is allocated for each wordline of the normal-side subbank, a required normal/meta ratio may be significantly satisfied without chip size overhead.

Figure 35:
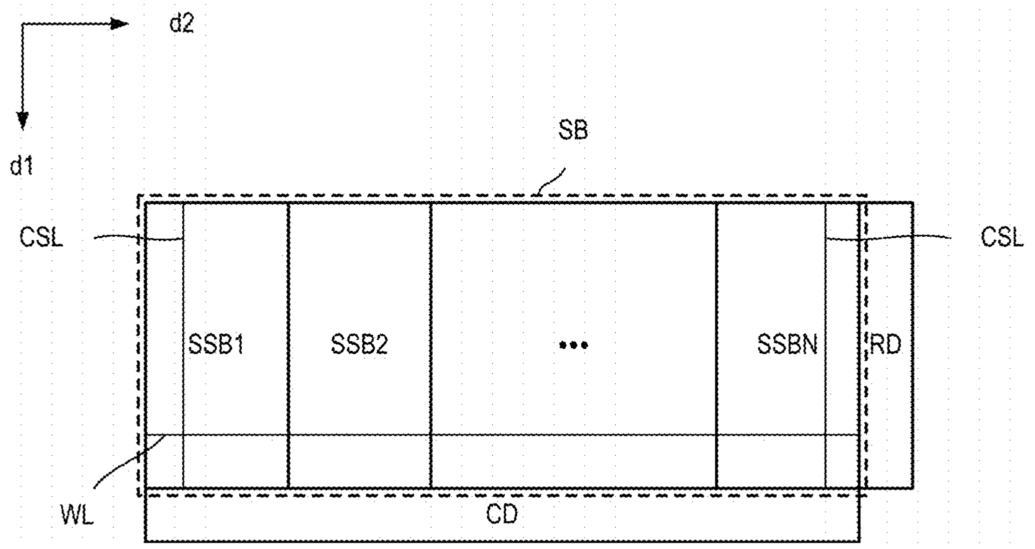
FIG. 35 is a diagram illustrating a subbank configuration according to an example embodiment.

FIG. 35 is a diagram illustrating an example subbank configuration.

Referring to FIG. 35, according to an example implementation, each subbank SB included in a single bank described above may be configured to include a plurality of subset banks SSB1 to SSBN. For example, the plurality of subset banks SSB1 to SSBN may be divided and arranged in a row direction d2. A wordline WL, connected to a row decoder RD, may be connected to the plurality of subset banks SSB1 to SSBN. According to the above-described implementations, when the subbank SB is a meta-side subbank SB, a portion of the wordlines WL may be allocated for metadata.

A CSL, connected to a column decoder CD, may be connected to the plurality of subset banks SSB1 to SSBN. A CSL may operate individually for each of the subset banks SSB1 to SSBN. For example, among CSLs, CSLs connected to a portion of the subset banks SSB1 to SSBN may be enabled, and CSLs connected to another portion of subset banks SSB1 to SSBN may be disabled.

Figure 36:
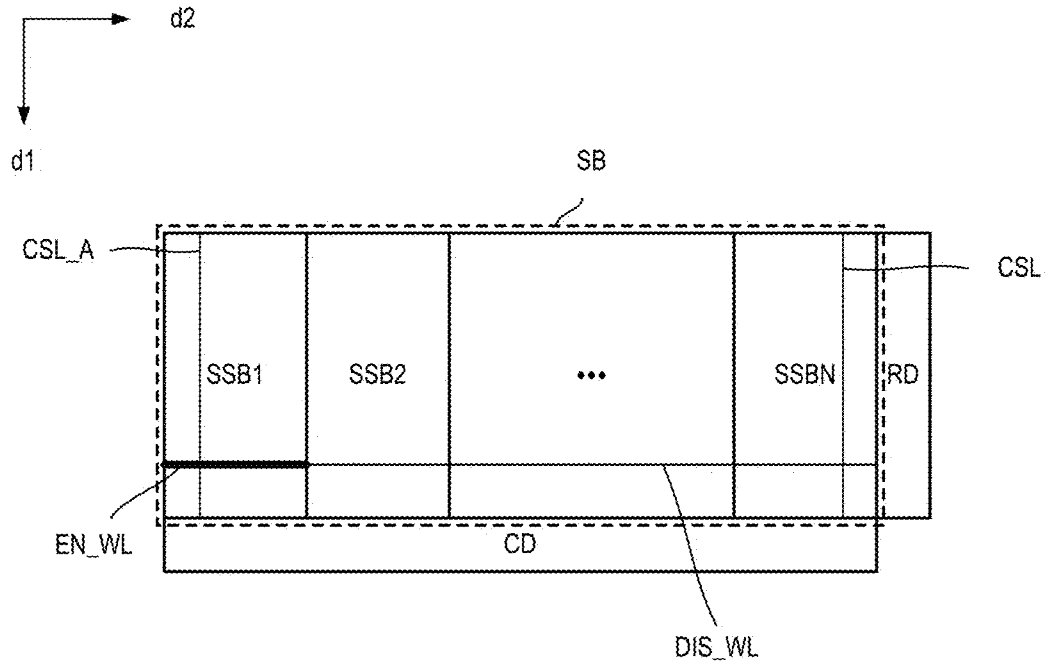
FIG. 36 is a diagram illustrating a wordline activation operation in the subbank configuration of FIG. 35.

FIG. 36 is a diagram illustrating a wordline activation operation in the subbank configuration of FIG. 35.

Referring to FIG. 36, a situation may be considered in which a wordline (for example, every r-th wordline) connected to a plurality of subset banks SSB1 to SSBN is allocated for metadata and the metadata is output from the corresponding wordline. For example, a subbank SB may operate as a meta-side subbank SB. Then, according to the above-described implementations, at least a portion of the CSL (or a pair of CSLs) of a specific wordline of the meta-side subbank SB may be allocated to read or write metadata corresponding to a normal data wordline of a normal-side subbank SB.

In this case, when the subbank SB is configured to include a plurality of subset banks SSB1 to SSBN in a row direction d2, an allocated CSL CSL_A may include only one of the plurality of subset banks SSB1 to SSBN. Based on the fact that at least a portion of CSLs (or a pair of CSLs) of a plurality of CSL subsets are activated for one of the plurality of subset banks SSB1 to SSBN, only a region corresponding to one of the subset banks SSB1 to SSBN may be enabled in every r-th wordline. Accordingly, according to an example implementation, only wordlines of a subset bank connected to the allocated CSL CSL_A may be enabled, and wordlines of the remaining subset banks may be disabled.

For example, in the case of FIG. 36, a CSL CSL_A allocated to a wordline of a normal-side subbank SB is connected to the first subset bank SSB1, so that only a wordline EN_WL connected to the first subset bank SSB1 may be enabled, and wordlines DIS_WL connected to the remaining banks SSB2 to SSBN may be disabled. Accordingly, the column decoder CD may operate to select the allocated CSL CSL_A, and the row decoder RD may operate to enable only the wordline EN_WL connected to the first subset bank SSB1.

According to the above-described implementations, in a memory device, only a wordline EN_WL of a subset bank to which allocated CSL CSL_A is connected, among all subbanks, may operate when a subbank SB is used as a meta-side subbank SB. This is because in this case, CSLs of the remaining subset banks included in the meta-side subbank SB are not used for an access to metadata. As a result, according to example implementations, power consumption may be reduced during normal data and metadata access operations may be reduced.

As set forth above, according to example implementations, a volatile memory device for allocating specific data may be provided.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While example implementations have been shown and described above, it will be apparent to those skilled in the art that modifications and variations could be made without departing from the scope of the present inventive concept as defined by the appended claims.

What is claimed is:

1. A memory device comprising:

a first bank connected to a plurality of wordlines and a plurality of column select lines (CSLs), wherein among the plurality of wordlines, every r-th wordline in a column direction is allocated for metadata, where r is a positive integer.

2. The memory device of claim 1, wherein the first bank comprises a first subbank and a second subbank divided in a row direction, and the first subbank is connected to a plurality of first wordlines among the plurality of wordlines, and the second subbank is connected to a plurality of second wordlines among the plurality of wordlines.

3. The memory device of claim 2, wherein among the plurality of first wordlines, every r-th first wordline in the column direction is allocated for metadata for the second subbank, and among the plurality of second wordlines, every r-th second wordline in the column direction is allocated for metadata for the first subbank.

4. The memory device of claim 3, wherein every r-th first wordline is allocated to the 1st through the (r-1)-th second wordlines among the plurality of second wordlines, and every r-th second wordline is allocated to the 1st through (r-1)-th first wordlines among the plurality of first wordlines.

5. The memory device of claim 2, wherein the first subbank is connected to a plurality of first CSL subsets among the plurality of CSLs, and the second subbank is connected to a plurality of second CSL subsets among the plurality of CSLs.

6. The memory device of claim 5, wherein the plurality of first CSL subsets and the plurality of second CSL subsets are each selected based on a column select signal among the plurality of CSLs.

7. The memory device of claim 5, wherein at least a portion of the plurality of first CSL subsets is allocated to at least one of remaining second wordlines, other than every r-th second wordline, among the plurality of second wordlines, and at least a portion of the plurality of second CSL subsets is allocated to one of the remaining first wordlines, other than every r-th first wordline, among the plurality of first wordlines.

8. The memory device of claim 2, further comprising:

a first row decoder configured to select one of the plurality of first wordlines, and a first column decoder configured to select a first CSL subset among the plurality of CSLs; and a second row decoder configured to select one of the plurality of second wordlines, and a second column decoder configured to select a second CSL subset among the plurality of CSLs.

9. The memory device of claim 8, wherein based on the first row decoder selecting a single first wordline from at least one of remaining first wordlines other than every r-th first wordline, among the plurality of first wordlines, the second row decoder selects a single second wordline, allocated to the single first wordline, from every r-th second wordline among the plurality of second wordlines.

10. The memory device of claim 8, wherein based on the second row decoder selecting a single second wordline from remaining second wordlines other than every r-th second wordline, among the plurality of second wordlines, the first row decoder selects a single first wordline, allocated to the single second wordline, from every r-th first wordline among the plurality of first wordlines.

11. The memory device of claim 1, wherein r is 8 or 16.

12. The memory device of claim 7, wherein r is 8, at least a portion of the plurality of first CSL subsets is a pair of first CSL subsets, and at least a portion of the plurality of second CSL subsets is a pair of second CSL subsets.

13. The memory device of claim 7, wherein r is 16, at least a portion of the plurality of first CSL subsets is a single first CSL subset, and at least a portion of the plurality of second CSL subsets is a single second CSL subset.

14. The memory device of claim 1, wherein the first bank is connected to a plurality of global input/output (GIO) lines, and the memory device further comprises a second bank adjacent to the first bank and disposed in the column direction of the first bank and configured to share the plurality of GIO lines with the first bank.

15. A memory device comprising:

a bank connected to a plurality of wordlines and a plurality of column select lines (CSLs);

a row decoder connected to the plurality of wordlines and extending in a column direction; and a column decoder connected to the plurality of CSLs and extending in a row direction, wherein among the plurality of wordlines, every r-th wordline in the column direction is allocated for metadata, where r is a positive integer.

16. The memory device of claim 15, wherein the bank comprises a first subbank and a second subbank divided in a row direction, and the first subbank is connected to a plurality of first wordlines among the plurality of wordlines, and the second subbank is connected to a plurality of second wordlines among the plurality of wordlines.

17. The memory device of claim 16, wherein based on selecting a single first wordline from remaining first wordlines other than every r-th first wordline, among the plurality of first wordlines, the row decoder selects a single second wordline, allocated to the single first wordline, from every r-th second wordline among the plurality of second wordlines.

18. The memory device of claim 16, wherein the first subbank is connected to a first CSL subset among the plurality of CSLs, and the second subbank is connected to a plurality of second CSL subsets, and the column decoder selects at least a portion of the plurality of first CSL subsets based on selecting a single second wordline from remaining second wordlines other than every r-th second wordline, among the plurality of second wordlines.

19. A memory device comprising:

a subbank divided in a row direction and comprising a plurality of subsets each divided in the row direction;

a plurality of wordlines extending in the row direction and connected to the subbank, wherein among the plurality of wordlines, every r-th wordline in a column direction is allocated for metadata, where r is a positive integer; and a plurality of column select line (CSL) subsets extending in the column direction and connected to the subbank.

20. The memory device of claim 19, wherein based on at least a portion of the plurality of CSL subsets being enabled for a single subset bank among the plurality of subsets, only a region corresponding to the single subset bank is enabled in the every r-th wordline.

* * * * *